United States Patent [19]
Araki et al.

[11] Patent Number: 5,789,069
[45] Date of Patent: Aug. 4, 1998

[54] MAGNETIC MULTILAYER FILM AND MAGNETORESISTANCE ELEMENT

[75] Inventors: Satoru Araki; Daisuke Miyauchi, both of Chiba, Japan

[73] Assignee: TDK Corporation, Tokyo, Japan

[21] Appl. No.: 614,211

[22] Filed: Mar. 12, 1996

Related U.S. Application Data

[62] Division of Ser. No. 111,900, Aug. 26, 1993, Pat. No. 5,514,452.

[30] Foreign Application Priority Data

Aug. 27, 1992 [JP] Japan ................................. 4-252106
Jul. 26, 1993 [JP] Japan ................................. 5-203562

[51] Int. Cl.$^6$ ......................................................... G11B 5/66
[52] U.S. Cl. .......................... 428/212; 428/213; 428/216; 428/692; 428/693; 428/694 R; 428/900; 324/252; 360/110; 360/113; 427/130; 427/131; 427/548
[58] Field of Search ............................... 428/213, 216, 428/692, 693, 694 R, 694 T, 694 TM, 900, 212; 324/252; 360/110, 113; 427/130, 131, 548

[56] References Cited

U.S. PATENT DOCUMENTS

| | | | |
|---|---|---|---|
| 5,366,815 | 11/1994 | Araki et al. | 428/611 |
| 5,510,172 | 4/1996 | Araki et al. | 428/213 |
| 5,514,452 | 5/1996 | Araki et al. | 428/213 |

*Primary Examiner*—Steven A. Resan
*Attorney, Agent, or Firm*—Oblon, Spivak, McClelland, Maier & Neustadt, P.C.

[57] ABSTRACT

A magnetic multilayer film having magnetoresistance (MR) is prepared by depositing at least two magnetic thin films having different coercive forces while interposing a non-magnetic thin film therebetween. A first magnetic thin film having a lower coercive force has a squareness ratio $SQ_1$ of 0.01–0.5, an anisotropic magnetic field Hk of 1–20 Oe, and a thickness $t_1$, a second magnetic thin film having a higher coercive force has a squareness ratio $SQ_2$ of 0.7–1.0 and a thickness $t_2 \leq t_1$, and the non-magnetic thin film has a thickness $t_3 \leq 200$ Å. A first preferred form requires 4 Å $\leq t_2 < 30$ Å and 6 Å $\leq t_1 \leq 200$ Å. A second preferred for requires 4 Å $\leq t_2 < 20$ Å and 10 Å $\leq t_1 < 20$ Å. A third preferred form requires 4 Å $\leq t_2 < 30$ Å and 6 Å $\leq t_1 \leq 40$ Å. The magnetic multilayer film has a great MR ratio of more than several percents in a low external magnetic field, a sharp rise at zero magnetic field and high heat resistance. It also has improved hysteresis and MR slope in an applied magnetic field between −10 Oe and +10 Oe. It additionally has a high MR slope of at least 0.15%/Oe in an applied magnetic field between −50 Oe and +50 Oe, improved hysteresis of MR ratio, and a high MR slope in a high-frequency magnetic field. There are obtained high sensitivity MR sensors and MR heads capable of high density magnetic recording.

28 Claims, 10 Drawing Sheets

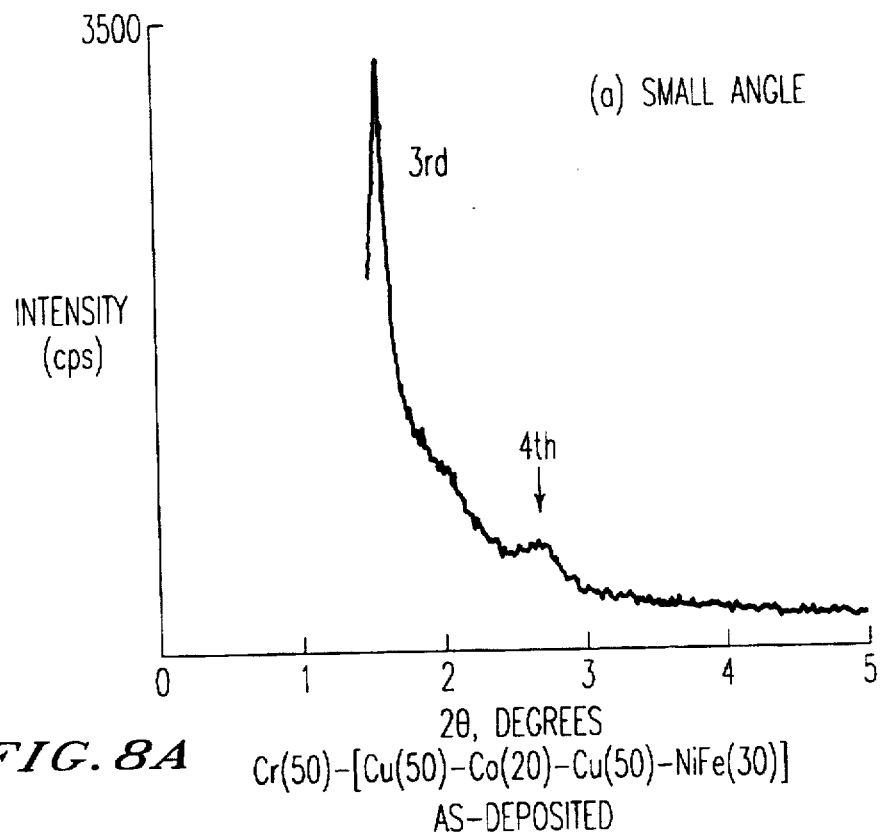
FIG. 8A  Cr(50)-[Cu(50)-Co(20)-Cu(50)-NiFe(30)]
AS-DEPOSITED
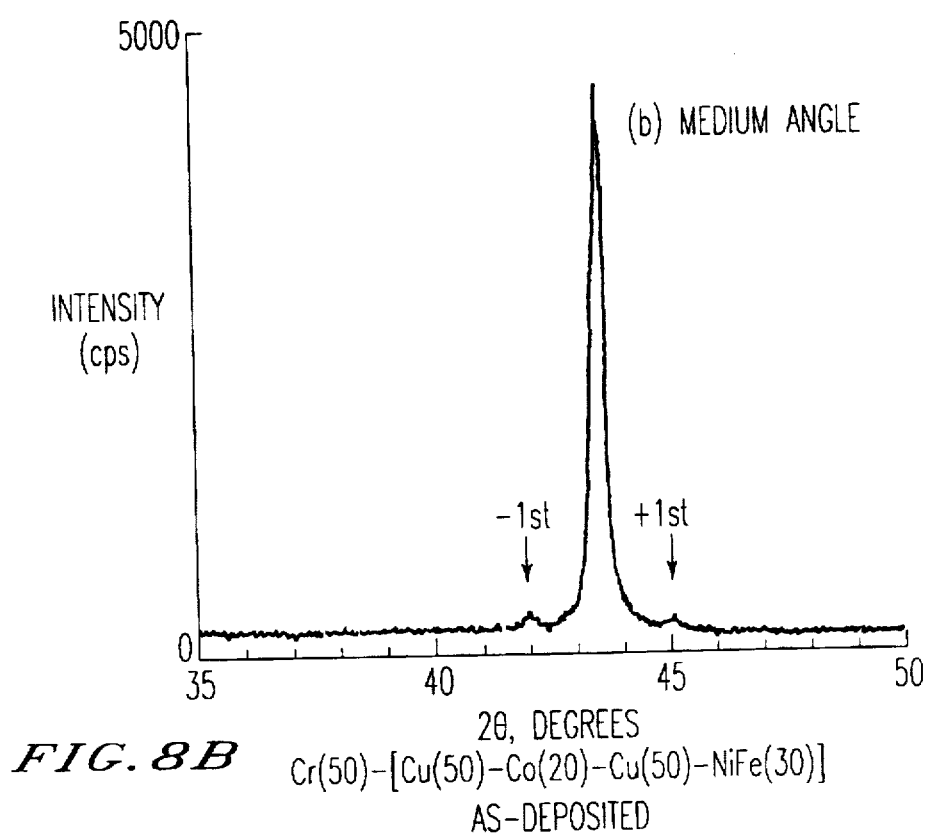
FIG. 8B  Cr(50)-[Cu(50)-Co(20)-Cu(50)-NiFe(30)]
AS-DEPOSITED Cr(50)-[Cu(50)-Co(20)-Cu(50)-NiFe(30)]
HEAT TREATED AT 250°C/2 HOUR/VACUUM

MAGNETIC MULTILAYER FILM AND MAGNETORESISTANCE ELEMENT

This is a Division, of application Ser. No. 08/111,900 filed on Aug. 26, 1993, now U.S. Pat. No. 5,514,452.

BACKGROUND OF THE INVENTION

1. Field of the Invention

This invention relates to a magnetoresistance element for reading the magnetic field intensity of magnetic recording media as signals, especially a magnetoresistance element capable of reading a small magnetic field change as a greater electrical resistance change signal and a magnetic multilayer film suitable for use therein. The term "magnetoresistance" is often abbreviated as MR, hereinafter.

2. Prior Art

There are growing demands for increasing the sensitivity of magnetic sensors and increasing the density of magnetic recording. Active research works have been devoted for the development of magnetoresistance affect type magnetic sensors (simply referred to as MR sensors, hereinafter) and magnetoresistance effect type magnetic heads (simply referred to as MR heads, hereinafter). Both MR sensors and MR heads are designed to read out external magnetic field signals by detecting changes in the resistance of a reading sensor portion formed of magnetic material. The MR sensors have the advantage of high sensitivity and the MR heads have the advantage of high outputs in high density magnetic recording since the reproduced output does not depend on the relative speed of the sensors or heads to the recording medium.

Conventional MR sensors of magnetic materials such as $Ni_{0.8}Fe_{0.2}$ (Permalloy) and NiCo utilizing anisotropic magnetoresistance effect offer only an MR ratio $\Delta R/R$ as small as 2 to 5% and are low in sensitivity as reading MR heads adapted to accommodate for ultrahigh density recording of the order of several GBPI.

Attention is now paid to artificial superlattices having the structure in which thin films of metal having a thickness of an atomic diameter order are periodically stacked since their behavior is different from bulk metal. One of such artificial superlattices is a magnetic multilayer film having ferromagnetic metal thin films and antiferromagnetic metal thin film alternately deposited on a substrate. Heretofore known are magnetic multilayer films of iron-chromium and cobalt-copper types. Among them, the iron-chromium (Fe/Cr) type was reported to exhibit a magnetoresistance change in excess of 40% at liquid He temperature (4.2K) (see Phys. Rev. Lett., Vol. 61, page 2472, 1988). This artificial superlattice magnetic multilayer film, however, is not commercially applicable as such because the external magnetic field at which a maximum resistance change occurs (that is, operating magnetic field intensity) is as high as ten to several tens of kilooersted (kOe). Additionally, there have been proposed artificial superlattice magnetic multilayer films of Co/Ag, which require too high operating magnetic field intensity.

Under these circumstances, a three-element or ternary magnetic multilayer film having two magnetic layers having different coercive forces deposited through a non-magnetic layer was proposed as exhibiting a giant MR change due to induced ferrimagnetism. For example, European Patent Application No. 0483 373 proposing such a magnetic multilayer film in which two magnetic layers disposed adjacent to each other through a non-magnetic layer have different coercive forces (Hc) and a thickness of up to 200 Å. Also the following reports are known.

(a) T. Shinjo &ad E. Yamamoto, Journal of the Physical Society of Japan, Vol. 59 (1990), page 3061

|Co(30)/Cu(50)/NiFe(30)/Cu(50)|×15 wherein the number in the parentheses represents the thickness in angstrom of the associated layer and the number after "x" is the number of repetition (the same applies hereinafter) produced an MR ratio of 9.9% at an applied magnetic field of 3000 Oe and about 9.5% at 500 Oe.

(b) E. Yammoto, Y. Okuyama, H. Dohnomae and T. Shinjo, Journal of Magnetism and Magnetic Materials, Vol. 99 (1991), page 243

In addition to (a), this article discusses the results of structural analysis, changes with temperature of MR ratio and resistivity, changes with the angle of external magnetic field, a minor loop of MR curve, dependency on stacking number, dependency on Cu layer thickness, and changes of magnetization cure.

(c) Hoshino, Hosoe, Jinpo, Kanda, Tsunashima and Uchiyama, Proceedings of Magnetics Research Meeting of the Japanese Electrical Society, MAG-91-161

This is a confirmation test of (a) and (b). Included are tests of dependency on Cu layer thickness and dependency on NiFe layer thickness. Also reported is the result about the dependency of coercivity of Co on Cu layer thickness which is simulatively determined from the magnetization curve by extrapolation. Magnetization curves are derived from NiFe (30)Cu(320) and Co(30)-Cu(320) and synthesized for comparison with a magnetization curve of NiFe(30)-Cu(160)-Co(30)-Cu(160). Since the thickness of the Cu intermediate layer is different from that of a three-elemynt multilayer, direct comparison of squareness ratio and coercivity is impossible.

(d) Okuyama, Yamamoto and Shinto, Proceedings of Magnetics Research Meting of the Japanese Electrical society, MAG-91-242

This article describes the phenomenological analysis on giant MR changes by induced ferrimagnetism. With the rotation of magnetic moment of an NiFe layer with low Hc, MR similarly changes. A giant MR phenomenon develops due to the artificially created spin anti-parallelism. It is proven by a difference in MR by an angular change of the applied magnetic field that this phenomenon is different from the anisotropic MR effect of NiFe or the like.

(e) R. Sakakima et al., Japanese Journal of Applied Physics, 31 (1992), L484

For RF sputtered NiFe/Co/Cu/Co multilayer film, microstructure and MR ratio are examined. Reported is an oscillatory phenomenon of MR ratio with the thickness of Cu layer when both the NiFe and Co layers have a fixed thickness of 30 Å. No magnetic field is applied during layer deposition.

(f) EP-A1 0483 373/1991

Disclosed is a magnetic multilayer film having two magnetic layers having different coercive forces stacked through an intervening non-magnetic layer. An exemplary structure includes a Ni-Fe layer of 25 Å or 30 Å thick, an intervening Cu layer, and a Co layer of 25 Å or 30 Å thick.

(g) JP-A 223306/1992

Disclosed is a magnetic multilayer film having two magnetic layers having different coercive forces stacked through an intervening non-magnetic layer. One magnetic layer is of CoPt base material.

These three-element magnetic multilayer films exhibit a giant MR ratio of about 10% under an applied magnetic field of up to about several hundreds of oersted, though the magnitude of MR ratio is small as compared with Fe/Cr, Co/Cu and Co/Ag. It is to be noted that these disclosures refer to only MR changes under an applied magnetic field of up to about 10 to 100 Oe.

For practical MR head material to find use in ultra-high density magnetic recording, an MR curve under an applied magnetic field of 0 to about 40 or 50 Oe is critical. The above-mentioned prior art three-element artificial superlattices, however, failed to increase MR changes under zero magnetic field, with an MR change approximate to 0. An increase of MR change becomes maximum at about 60 Oe and an MR ratio of about 9% is then obtained. This implies that the MR curve has a slow rise. In the case of Permalloy (NiFe), the MR change has a gradient of approximately 0 across zero magnetic field, the MR ratio remains substantially unchanged, the differential value of MR ratio is close to 0, and magnetic field sensitivity is low. The material is not suitable as reading MR heads for ultra-high density magnetic recording.

For overcoming such properties, NiFe is provided with a shunt layer having low resistivity such as Ti for providing a shift of the operating point. In addition to the shunt layer, a soft film bias layer of soft magnetic material having a high resistivity such as CoZrMo and NiFeRh is provided for applying a bias magnetic field. The structure having such a bias layer, however, is complex in steps, difficult to provide stable properties, and increased in cost. It also invites a lowering of S/N since it uses a relatively moderate portion of the MR curve.

Moreover, MR heads have a complex layered structure, require heat treatment such as baking and curing of resist material during patterning and flattening steps, and must tolerate temperatures of about 350° C. Conventional three-element artificial superlattice magnetic multilayer films, however, degrade their properties during such heat treatment.

The following reports were published after the filing date in Japan of the basic application, but before the filing date of this application in the U.S.

(h) EFF-A1 0498 344/1992

Disclosed is a magnetic multilayer film having stacked through an intervening non-magnetic thin film two magnetic thin films of $(Ni_xCo_{1-x})_{x'}Fe_{1-x'}$ and $(Co_yNi_{1-y})_zFe_{1-z}$ wherein $x=0.6-10$, $x'=0.7-1.0$, $y=0.4-1.0$, and $z=0.8-1.0$. An exemplary structure includes a nonmagnetic thin film of 50 Å thick intervening between two magnetic thin films of 30 Å thick.

(i) T. Valet et al., Applied Physics Letters, 61 (1992) 3187

For RF sputtered $Ni_{80}Fe_{20}/Cu/Co$ multilayer film, an oscillatory phenomenon of MR ratio with the thickness of Cu layer is reported. Samples of [NiFe(50)-Cu(x)-Co(20)-Cu(x)]×3 wherein $7 \leq x \leq 37$ were deposited by RF sputtering in the absence of a magnetic field. It is described that an MR change component attributable to differential coercive force is found only at $x=33$ Å.

(j) T. Valet et al., Journal of Magnetism and Magnetic Materials, 121 (1993) 402

For RF sputtered $Ni_{80}Fe_{20}/Ca/Co$ multilayer film, microstructure and MR change are examined. Reported are cross-sectional electron photomicrographs (TEM) of two samples: [NiFe(50)-Cu(50)-Co(10)-Cu(50)]×12 and [NiFe(50)-Cu(50)Co(100)-Cu(50)]×8, and MR characteristics of two simplest [NiFe(50)-Cu(20)-Co(30)-Cu(20)]×18 and [NiFe(50)-Cu(20)-Co(30)-Cu(20)]×3. A 18-layer stack, for example, shows an MR change of 11% at room temperature which is allegedly attributable to differential coercive force. No magnetic field is applied during layer deposition.

(k) Journal of Magnetism and Magnetic Materials, 121 (1993) 339

Described is a magnetization reversal mechanism of sputtered [NiFe(50)-Cu(x)-Co(20)-Cu(x)]×3. MR characteristics are referred to nowhere. No magnetic field is applied during layer deposition.

in the aforementioned publications, no magnetic field is applied during layer deposition and NiFe layers are provided with no magnetic anisotropy ad thus have high squareness ratios. As a result, the MR ratio in the range between −10 Oe and +10 Oe has great hysteresis centered at zero magnetic field and the MR slope in that range is small, indicating failure to provide satisfactory and stable reproduction as magnetic heads.

For MR heads intended for ultra-high density magnetic recording, an MR change curve under an applied magnetic field between −50 Oe and +50 Oe is important. However, in all the examples of the aforementioned publications, the MR ratio in the range between −50 Oe and +50 Oe has great hysteresis centered at zero magnetic field and the MR slope in that range is small.

Often MR heads are used in a hiuh-frequency magnetic field of 1 MHz or higher for reproduction of high density recorded signals. Most prior art three-element magnetic multilayer films are difficult to provide high high-frequency sensitivity by producing an MR slope (or MR change curve slope) of 0.08%/Oe or more in a high-frequency magnetic field of 1 MHz or higher partly because of their film thickness combination.

SUMMARY OF THE INVENTION

A primary object of the present invention is to provide a novel and improved magnetic multilayer fi exhibiting a high MR ratio, a linear rise of MR change under an applied magnetic field of a narrow range, for example, of 0 to 40 Oe, high magnetic field sensitivity, and high heat resistant temperature.

Another object of the present invention is to provide a novel and improved magnetic multilayer film which is improved in hysteresis and R slope under an applied magnetic field, for example, between −10 Oe and +10 Oe.

A further object of the present invention is to provide a novel and improved magnetic multilayer film which exhibits a great MR slope of at least 0.15%/Oe under an applied magnetic field, for example, in the range between −50 Oe and +50 Oe, improved hysteresis, and a great MR slope under a high-frequency magnetic field.

A still further object is to provide a magnetoresistance element using such a magnetic multilayer film.

According to the present invention, a magnetic multilayer film includes at least two magnetic thin films stacked through an intervening non-magnetic thin film. The magnetic thin film adjoin each other through the non-magnetic thin film and have different coercive forces. A first magnetic thin film having a lower coercive force has a thickness $t_1$ and a squareness ratio $SQ_1$ of 0.01 to 0.5, a second magnetic thin film having a higher coercive force has a thickness $t_2$ and a squareness ratio $SQ_2$ of 0.7 to 1.0, and the non-magnetic thin film has a thickness $t_3$. All the thicknesses $t_1$, $t_2$ and $t_3$ are up to 200 Å.

Preferably $SQ_2/SQ_1$ ranges from 2 to 100. The first magnetic thin film has an anisotropic magnetic field Hk of 1 to 20 Oe, more preferably 3 to 20 Oe.

In a first preferred form of the present invention, the film thicknesses $t_1$, $t_2$ and $t_3$ are controlled to fall in the range: 4 Å$\leq t_2$<30 Å, 6 Å$\leq t_1 \leq$200 Å, $t_1 \geq t_2$, and $t_3 \leq$200 Å. In a second preferred form of the present invention, the film thicknesses $t_1$, $t_2$ and $t_3$ are controlled to fall in the range: 4 Å$\leq t_2$<20 Å, 10 Å$\leq t_1$<20 Å, $t_1 \geq t_2$, and $t_3 \leq$200 Å. In a third preferred form of the present invention, the film thicknesses $t_1$, $t_2$ and $t_3$ are controlled to fall in the range: 4 Å$\leq t_2$<30 Å, 6 Å$\leq t_1 \leq$40 Å, $t_1 \geq t_2$, and more preferably $t_3$<50 Å.

Preferably, the magnetic multilayer film produces a magnetoresistance curve including a linear portion having a slope of at least 0.15%/Oe in the magnetic field range between −50 Oe and +50 Oe. The curve has a maximum hysteresis width of up to 20 Oe.

Preferably, the first magnetic thin film has a composition $(Ni_xFe_{1-x})_yCo_{1-y}$ wherein $0.7 \leq x \leq 0.9$ and $0.5 \leq y \leq 1.0$. The second magnetic thin film has a composition $(Co_zNi_{1-z})_wFe_{1-w}$ wherein $0.4 \leq z \leq 1.0$ and $0.5 \leq w \leq 1.0$.

A magnetic multilayer film as defined above is preferably prepared by a method including applying a magnetic field of 10 to 300 Oe in one in-plane direction during deposition of the first magnetic thin film. The method further includes depositing at least two magnetic thin films, while interposing a non-magnetic thin film therebetween and effecting heat treatment at a temperature of up to 500° C.

There is also provided a magnetoresistance element comprising a magnetic multilayer film as defined above on a substrate. The magnetoresistance element is free of a bias magnetic field applying mechanism.

ADVANTAGES

In order that a three-element magnetic multilayer film possess an MR curve having good linearity across zero magnetic field and a steep slope and improved heat resistance, only a difference in coercive force (Hc) as described in the above-cited references (a) to (d) is insufficient. The squareness ratio and thickness of first and second magnetic thin films must be restricted in accordance with the invention before such a favorable rise and heat resistance can be established. The squareness ratio and relative thickness of first and second magnetic thin films are not taught in the above-cited publications (a) to (g) and our preceding application.

Where the magnetic thin films are thinner, there generates reduced magnetic interaction between the first and second magnetic thin film so that the multilayer film exits improved hysteresis and slope of MR ratio under an applied magnetic field, for example, between −10 Oe and +10 Oe. This tendency is not taught in the above-cited publications.

In order that a three-element magnetic multilayer film show an MR slope of at least 0.15%/(Oe, which Is a maximum differential value determined from a differential curve of an MR curve developed under an applied magnetic field, for example, in the range between −50 Oe and +50 Oe, improved hysteresis, and a great MR slope under a high-frequency magnetic field, the film thicknesses $t_1$, $t_2$ and $t_3$ are controlled to fall in the range defined in the third preferred form and the first magnetic thin film is deposited under an applied magnetic field. Such relative film thickness control and film formation under an applied magnetic field are not taught in the above-cited publications.

BRIEF DESCRIPTION OF THE DRAWINGS

FIG. 8 is an X-ray diffraction pattern of a magnetic multilayer film in the first preferred form as-deposited.

DETAILED DESCRIPTION OF THE INVENTION

Figure 2:
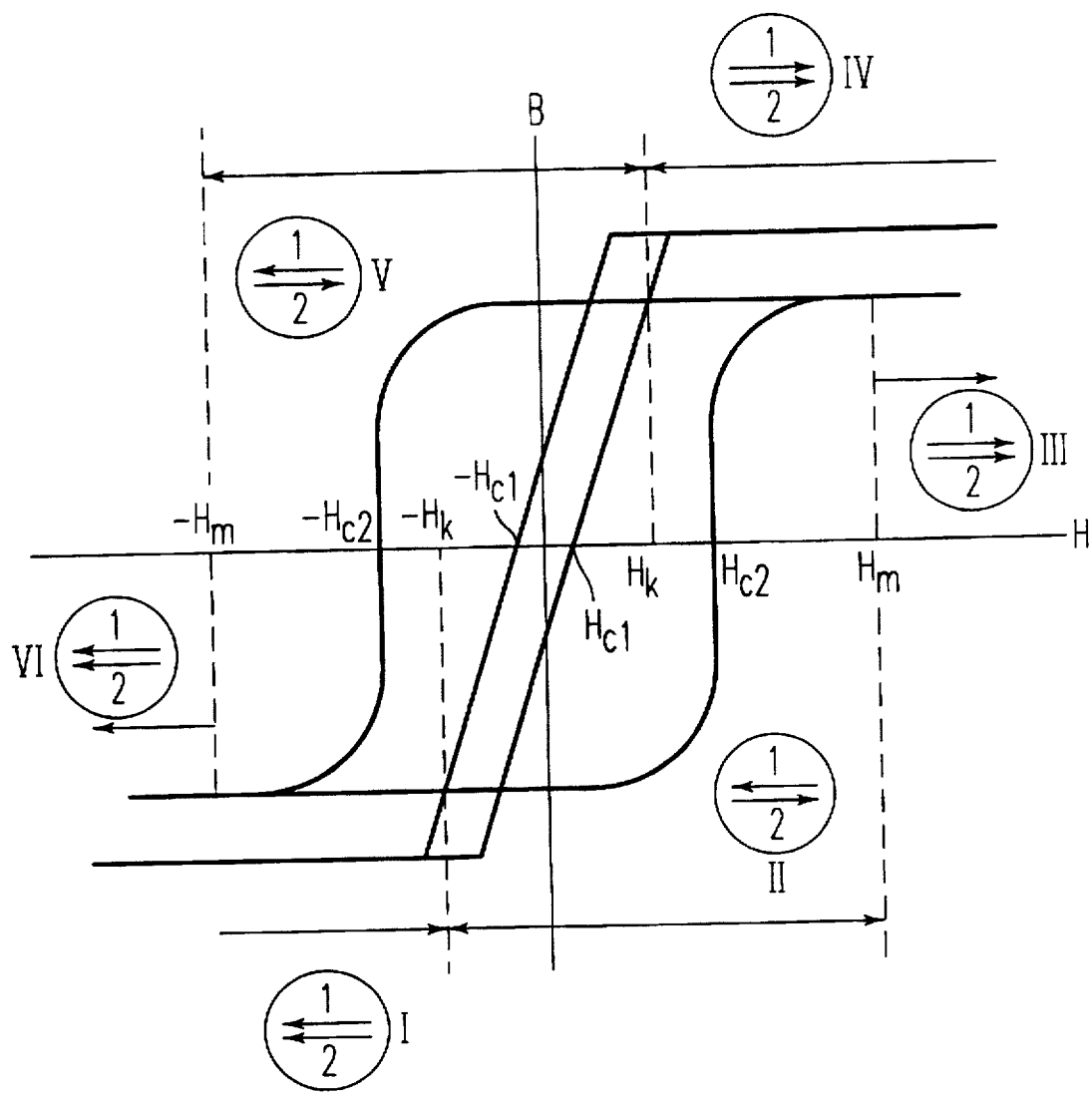
FIG. 2 is a diagram showing exemplary B-H curves for explaining the principle of the invention.

According to the present invention, first and second magnetic thin films which are disposed adjacent to each other through a non-magnetic thin film must have different coercive forces. This is because the principle of the invention is that conducting electrons are subject to spin-dependent scattering to increase resistance as adjacent magnetic layers are offset in the direction of magnetization, and the resistance reaches maximum when the adjacent magnetic Layers have opposite directions of magnetization. More particularly, when an external magnetic field is intermediate the coercive force $Hc_1$ of the first magnetic thin film and the coercive force $Hc_2$ of the second magnetic thin film ($Hc_1$<H<$Hc_2$) as shown in FIG. 2, the adjacent magnetic layers will have opposite components in their magnetization direction, resulting in an increased resistance.

Now, the external magnetic field, coercive force and magnetization direction of a three-element artificial superlattice magnetic multilayer film are described.

Figure 1:
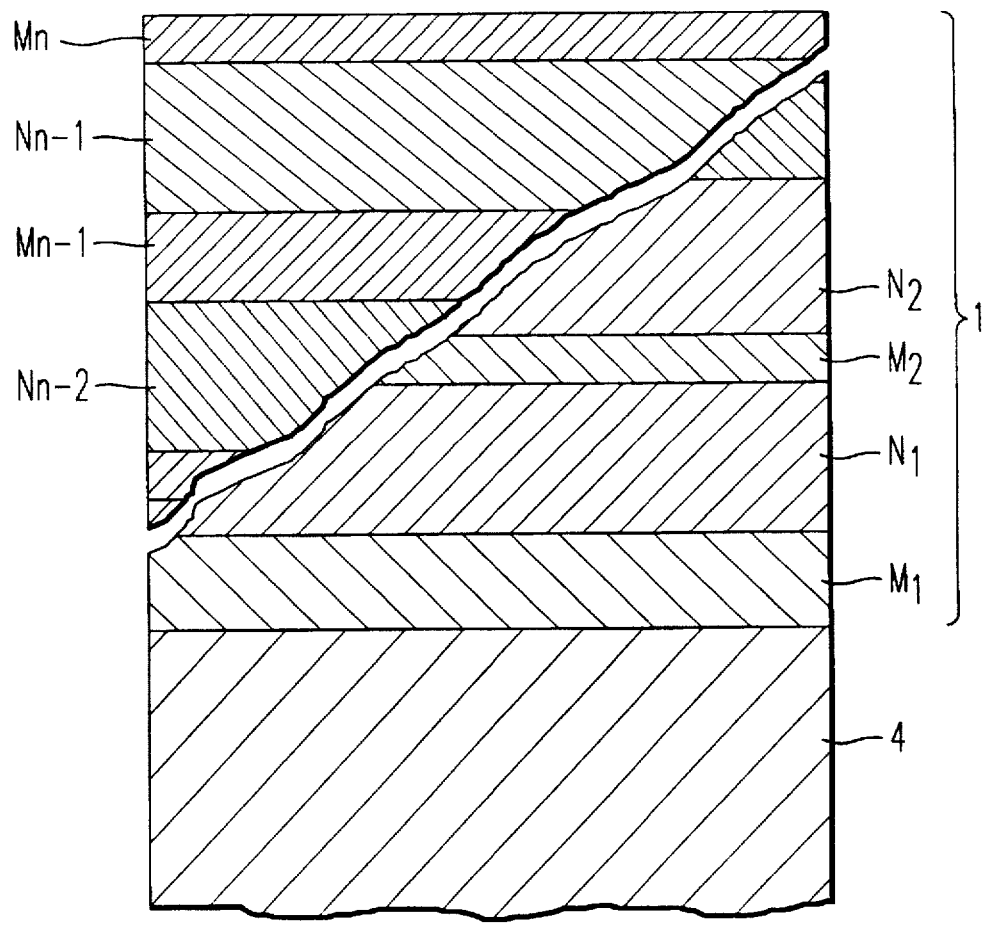
FIG. 1 is a fragmental cross section of a magnetic multilayer film according to the invention.

Referring to FIG. 1, there is shown in cross section an artificial superlattice magnetic multilayer film 1 according to one embodiment of the invention. The magnetic multilayer film 1 includes magnetic thin films $M_1, M_2, \ldots, M_{n-1}$, and $M_n$ on a substrate 4 and non-magnetic thin films $N_1, N_2, \ldots, N_{n-2}$, and $N_{n-1}$ each between a pair of two adjacent magnetic thin firms.

For the sake of brevity of description only, reference is made to the embodiment having only two types of magnetic thin films having different coercive forces. As shown in FIG. 2, the two types of magnetic thin films (1) and (2) have different coercive forces $Hc_1$ and $Hc_2$, respectively ($0<Hc_1<Hc_2$). The first magnetic thin film (1) has n anisotropic magnetic field Hk and the magnetization of the second magnetic thin film (2) is saturated at an external magnetic field Hm. At the initial, an external magnetic field H is applied wherein H<−Hm. The first and second magnetic thin films (1) and (2) have magnetization directions oriented in a negative (−) direction same as H. Then the external magnetic field is increased to region I of H<−Hk where both the magnetic thin films have magnetization directions oriented in one direction. As the external magnetic field is increased to region II of −Hk<H<Hk, magnetic thin film (1) partially starts reversing its magnetization direction so that the magnetization directions of magnetic thin films (1) and (2) may include opposite components. The magnetization directions of magnetic thin films (1) and (2) are in substantially complete anti-parallelism in the range of $Hk<H<Hc_2$. When the external magnetic field is further increased to region III of Hm<H, magnetic thin films (1) and (2) have magnetization directions aligned in a positive (+) direction.

Now, the external magnetic field a is reduced. In region IV of Hk<H, the magnetic thin films (1) and (2) have magnetization directions still aligned in a positive (+) direction. In region V of −Hk<H<+Hk, the magnetic thin film (1) starts reversing its magnetization direction in one direction so that the magnetization directions of magnetic thin films (1) and (2) may include opposite components. Subsequently in region VI of H<−Hm, the magnetic thin films (1) and (2) have magnetization directions aligned in one direction again.

In the regions II and V where the magnetic thin films (1) and (2) have opposite magnetization directions, conducting electrons are subject to spin-dependent scattering, resulting in an increased resistance. In the zone of −Hk<H<Hk in region II, magnetic thin film (2) undergoes little magnetization reversal, but magnetic thin film (1) linearly increases its magnetization, the proportion of conducting electrons subject to spin-dependent scattering is gradually increased in accordance with a magnetization change of magnetic thin film (1). By selecting a low Hc material such as $Ni_{0.8}Fe_{0.2}$ ($Hc_2$=several Oe) as the first magnetic thin film (1), imparting appropriate Hk thereto and selecting a somewhat high Hc, high squareness ratio material such as Co ($Hc_2$=several tens of Oe) as the second magnetic thin film (2), for example, there is obtained an MR element exhibiting a linear MR change and a great MR ratio in a low external magnetic field in the range of several oersteds to several tens of oersted near or below Hk.

The magnetic materials of which the magnetic thin films are formed herein are not critical although they are preferably selected from Fe, Ni, Co, Mn, Cr, Dy, Er, Nd, Tb, Tm, Ce and Gd. Also useful are alloys and compounds containing these elements, for example, Fe-Si, Fe-Ni, Fe-Co, Fe-Al, Fe-Al-Si (Sandust etc.), Fe-Y, Fe-Gd, Fe-M, Co-Ni, Cr-Sb, Fe system amorphous alloys, Co system amorphous alloys, Co-Pt, Fe-C, Mn-Sb, Ni-Mn, Co-O, Ni-O, Fe-O, Fe-Al-Si-N, Ni-F, and ferrite. In the practice of the invention, two or more materials having different coercive forces are selected from the foregoing materials to form the magnetic thin films.

In the invention, the magnetic thin films have a thickness of up to 200 Å. If the thickness exceeds 200 Å, the advantages are not lost, but no further advantages are obtained with a thickness increase, and wastes are increased upon manufacture. The lower limit of the magnetic thin film thickness is 4 Å below which the films have a Curie point lower than room temperature and loge practical value. A thickness of 4 Å or more facilitates to form a film of uniform thickness and of quality and avoids an excess reduction of the magnitude of saturation magnetization.

In the invention, the respective magnetic thin films have coercive forces Hc which may be suitably selected in the range of, for example, 0.001 Oe to 10 kOe, especially 0.01 to 1000 Oe, depending on the intensity of an applied external magnetic field and the MR ratio required for the element associated therewith. The ratio in coercive force between adjacent magnetic thin film, $Hc_2/Hc_1$ is preferably from 1.2:1 to 100:1, especially from 1.5:1 to 100:1, more preferably from 2:1 to 80:1, especially from 3:1 to 60:1, most preferably from 5:1 to 50:1, especially from 6:1 to 30:1. Outside the range, a higher ratio would result in a broader MR curve whereas a lower ratio leads to a close difference between coercive forces, failing to take advantage of anti-parallelism.

Coercive force Hc is measured as follows because it is impossible to directly measure the magnetic properties of magnetic thin films in a magnetoresistance element. Magnetic thin films to be measured for Hc are deposited by evaporation alternately with non-magnetic thin films until the total thickness of the magnetic thin films reaches about 200 to 400 Å. The resulting sample is measured for magnetic properties. It is to be noted that the thickness of magnetic thin films, the thickness of non-magnetic thin films, and the composition of non-magnetic thin films are the same as in a magnetoresistance element to be examined.

In order to provide an MR curve having good linearity across zero magnetic field S improved heat resistance, the first magnetic thin film having lower Hc and the second magnetic thin film having higher Hc mast have controlled residual magnetization Mr at zero magnetic field, that is, controlled squareness ratio SQ=Mr/Ms. The first magnetic thin film should preferably have a squareness ratio $SQ_1$ of $0.01 \leq SQ_1 \leq 0.5$, more preferably $0.01 \leq SQ_1 \leq 0.4$, most preferably $0.01 \leq SQ_1 \leq 0.3$. The second magnetic thin film should preferably have a squareness ratio $SQ_2$ of $0.7 \leq SQ_2 \leq 1.0$. Since the first magnetic thin film governs the rise of MR change in the vicinity of zero magnetic field, its squareness ratio $SQ_1$ as small as possible is preferred. More particularly, with smaller $SQ_1$, magnetization will gradually rotate and anti-parallelism will gradually increase in the vicinity of zero magnetic field, resulting in a linear MR curve across zero magnetic field. With $SQ_1$ larger than 0.5, it is difficult to provide a linear MR change. The lower limit of $SQ_1$ from the manufacturing aspect is about 0.01.

The second magnetic thin film to be combined with the first magnetic thin film should preferably have a squareness ratio $SQ_2$ close to 1 in the vicinity of zero magnetic field. With a squareness ratio $SQ_2$ of 0.7 or higher, the rise of MR change in the vicinity of zero magnetic field become sharp and a great MR ratio is obtainable. The first magnetic thin film should preferably have an anisotropic magnetic field Hk of 1 to 20 Oe, more preferably 2 to 12 Oe, most preferably 3 to 10 Oe. With Hk>20 Oe, the range of magnetic field where linearity is obtained is expanded, but the elope of an MR curve is reduced with an accompanying drop of resolution. With Hk<1 Oe, linearity is obtained only in a range of magnetic field which is too narrow to exert the function as MR elements.

Preferably $SQ_2/SQ_1$ is between 2 and 100, especially between 2 and 50.

It is desirable to more positively control the squareness ratio or the rise of an MR curve and heat resistance by optimizing the thickness of the first and second magnetic thin film. If both the first and second magnetic thin films have an equal thickness as in most examples described in the above-cited publications (a) to (d), then both the thin films have a squareness ratio closer to 1.0 as their thickness increases. This means that the magnetization curve contains no definite bend of magnetization. As a result, the MR curve starts rising at several tens of Oe, undesirably exhibiting poor linearity at zero magnetic field. Then the first and second magnetic thin films will exhibit better linearity or better rise when both are thin. However, if both are as thin as about 10 Å, for example, then a heat resistance problem arises. More particularly, when heated in vacuum at temperatures of about 350° C., the first magnetic thin film undergoes a substantial loss of squareness ratio while the second magnetic thin film undergoes little loss of squareness ratio. It is found that the first magnetic thin film will have a squareness ratio of up to 0.5 when it is thicker. Then by somewhat increasing the thickness of the first magnetic thin film independent of the second magnetic thin film, better MR properties are available after heat treatment. Heat resistance is improved while suppressing any deterioration of the squareness ratio of the first magnetic thin film after heat treatment.

Therefore, in addition to the limitation of $SQ_1$ and $SQ_2$, the thicknesses $t_1$ and $t_2$ of the first and second magnetic thin films are preferably controlled to the range: 4 Å$\leq t_2 <$30 Å, 6 Å$\leq t_1 \leq$200 Å, and $t_2 \leq t_1$, more preferably 4 Å$\leq t_2 \leq$30 Å, 6 Å$\leq t_1 <$200 Å, and $t_2 \leq t_1$.

In a first preferred form of the invention, these thicknesses are controlled to the range: 4 Å$\leq t_2<$30 Å, 20 Å$\leq t_1 \leq$200 Å, and $t_2 \leq t_1$, preferably 4 Å$\leq t_2 \leq$28 Å, 22 Å$\leq t_1 \leq$100 Å, and $t_2<t_1$, especially 1.05$t_2 \leq t_1$. With $t_2 \geq$30 Å, there is some likelihood that the overall structure have increased resistivity and eventually a reduced MR ratio. It is impossible to form a continuous film having a thickness $t_2<$4 Å. With $t_1<$20 Å, there is some loss of heat resistance. For linearity, the upper limit of $t_1$ is desirably 200 Å, especially 100 Å. If $t_2>t_1$, there result low heat resistance and a reduced MR ratio when the structure is subject to heat during the manufacturing process.

By controlling the squareness ratio and thickness of the first and second magnetic thin films, a magnetic multilayer film as deposited exhibits an MR ratio as high as 5% or more, especially 6 to 12%, better linearity across zero magnetic field, and an increased MR slope. More specifically, the difference in MR ratio under an applied magnetic field of from −3 Oe to +3 Oe is 0.5% or more, typically about 1 to 2%, which is sufficient as reading MR heads for ultra-high density recording.

By controlling $t_1$ and $t_2$ as mentioned above, the present invention improves heat resistance so that deterioration of properties, especially an MR ratio by heat treatment is minimized. More specifically, after heat treatment in vacuum at 250° C. to about 350° C., for example, the MR ratio is maintained at 70% or more of that prior to heat treatment, that is, an MR ratio of at least 5%, especially at least 6% is obtained. Such heat treatment is encountered, for example, during an MR head manufacturing process. If a proper set of conditions is selected, the gradient across zero magnetic field as represented by the difference in MR ratio under an applied magnetic field between −3 Oe and +3 Oe will be rather improved, for example, from 25% decrease prior to heat treatment to 100% increase after heat treatment. A gradient of 0.5% or more, typically about 1 to 2%, which is sufficient as reading MR heads for ultra-high density recording can be obtained even after heat treatment. It is to be noted that after heat treatment, $SQ_1$ remains in the range of 0.01 to 0.5 and $SQ_2$ remains in the range of 0.7 to 1.0.

The non-magnetic thin films are formed of a material which plays the role of attenuating the magnetic interactions between magnetic thin films having different coercive forces. The non-magnetic material is not critical and may be selected from metallic and metalloid non-magnetic materials and non-metallic non-magnetic materials. Preferred examples of the metallic non-magnetic material include Au, Ag, Cu, Pt, Al, mg, Mo, Zn, Nb, Ta, V, Hf, Sb, Zr, Ga, Ti, Sn and Pb and alloys thereof. Examples of the metalloid non-magnetic material include Si, Ge, C, and B, which may optionally contain an additional element or elements. Examples of the nonmetallic non-magnetic material include $SiO_2$, SiO, SiN, $Al_2O_3$, ZnO, MgO, and TiN, which may optionally contain an additional element or elements.

In the first preferred form of the invention, the non-magnetic thin film should have a thickness $t_3$ of up to 200 Å, in general, with a film thickness in excess of 200 Å, the resistance largely depends on a nonmagnetic thin film, leaving little margin for spin-dependent scattering and resulting in a reduced MR ratio. On the other hand, a non-magnetic thin film of a reduced thickness will allow greater magnetic interactions to develop between magnetic thin films, prohibiting both the magnetic thin films from exhibiting different magnetization directions, and it is difficult to form a continuous film of such a reduced thickness. For these reasons, a thickness of at least 4 Å is preferred. The more preferred range of $t_3$ is less than 50 Å as will be described later.

Understandably, the thickness of magnetic thin films and non-magnetic thin films can be measured by means of a transmission electron microscope or scanning electron microscope or by Auger electron spectroscopy. The crystal structure of thin films can be observed by X-ray diffraction or high speed electron diffraction analysis.

The second preferred form of the invention requires to control the respective film thicknesses to fall in the range: 4 Å$\leq t_2 <$20 Å, 10 Å$\leq t_1 <$20 Å, $t_1 \geq t_2$. By reducing the thicknesses of the magnetic thin films, the magnetic interactions between the first and second magnetic thin films via the non-magnetic thin film layer are reduced so that the respective magnetic thin films can be independently liable to magnetization reversal. Then the multilayer film exhibits a high MR ratio as wall as excellent hysteresis properties of MR ratio and a sharp MR slope in an applied magnetic field, for example, in the range between −10 Oe and +10 Oe. It is impossible to form a continuous film having a thickness $t_2<$4 Å. If $t_2>t_1$, the ratio between the overall magnetization quantities of the first and second magnetic thin film layers goes out of balance and the proportion of conducting electrons subject to spin-dependent scattering is reduced, resulting in losses of properties.

Even when the thicknesses of the magnetic thin films are reduced as defined above, heat resistance at about 250° C. remains high enough for practical applications. With respect to the magnetic materials, coercive force Hc, squareness ratio $SQ_2/SQ_1$ and anizotropic magnetic field Hk of the magnetic thin films, and the non-magnetic thin film, the same conditions as previously described are useful.

In the third preferred form of the invention, the thicknesses $t_1$, $t_2$ and $t_3$ of the first magnetic thin film, second magnetic thin film and nonmagnetic thin film should be controlled to fall in the range: 4 Å≤$t_2$<30 Å, 6 Å≤$t_1$≤40 Å, $t_1$≥$t_2$, and $t_3$<50 Å, more preferably 6 Å≤$t_2$≤28 Å, 8 Å≤$t_1$≤36 Å, $t_1$>$t_2$, especially $t_1$≥1.05$t_2$, and 8 Å≤$t_3$≤48 Å. With $t_2$≥30 Å, there is some likelihood that the overall structure have increased resistivity and eventually a reduced MR ratio. It is impossible to form a continuous film having a thickness $t_2$<4 Å. With $t_1$>40 Å, the maximum hysteresis width of an MR curve exceeds 20 Oe, and if the resulting MR element is used as a magnetic head, there undesirably appears a widely varying output voltage. With $t_1$<6 Å, the structure would show unsatisfactory magnetic properties, resulting in losses of MR ratio, MR slope and heat resistance, and its MR curve would have an increased maximum hysteresis width. If $t_2$>$t_1$, the ratio between the overall magnetization quantities of the first and second magnetic thin film layers goes out of balance and the proportion of conducting electrons subject to spin-dependent scattering is reduced, resulting in losses of properties.

With respect to the magnetic materials, coercive force Hc, squareness ratio $SQ_2/SQ_1$ and anisotropic magnetic field Hk of the magnetic thin films, the same conditions as previously described are useful.

For magnetic thin film satisfying these properties, preferably the first magnetic thin film is formed of a material containing at least 70% by weight of a composition: $(Ni_xFe_{1-x})_yCo_{1-y}$, wherein letters x and y are 0.7≤x≤0.9 and 0.5≤y≤1.0 and the second magnetic thin film is formed of a material containing at least 70% by weight of a composition $(Co_zNi_{1-z})_wFe_{1-w}$ wherein letters z and w are 0.4≤z≤1.0 and 0.5≤w≤1.0.

The thickness $t_3$ of the non-magnetic thin film is preferably less than 50 Å, more preferably 8 Å to 48 Å, especially 30 to 48 Å especially for reproducibility and stability of film physical properties and 35 to 48 Å for mass production. For cost effective manufacture, $t_3$ may be less than 30 Å, especially 10 to 28 Å. When the thickness $t_3$ of the non-magnetic thin film is above 50 Å, there is some likelihood that the structure have a low MR ratio and a small MR slope in a high-frequency magnetic field of 1 MHz. The non-magnetic thin film may be made of the same material as previously described.

In the embodiments wherein the thicknesses of the magnetic and non-magnetic layers are controlled in the above-defined ranges, the anisotropic magnetic field Hk of the first magnetic thin film can be controlled to 3 to 20 Oe, more preferably 3 to 16 Oe, especially 3 to 12 Oe by depositing the first magnetic thin film in an external magnetic field applied in one direction in a plane coextensive with the film. Then there are obtained a high MR ratio of at least 5% especially 6 to 12%, high heat resistance, and the MR change curve has an MR slope of at least 0.15%/Oe, ore preferably at least 0.18%/Oe, especially 0.20 to 0.60%/Oe in an applied magnetic field in the range between −50 Oe and +50 Oe and a maximum hysteresis width of up to 20 Oe, typically up to 16 Oe, especially 0 to 14 Oe. In addition, the MR slope in a high-frequency magnetic field of 1 MHz is at least 0.08%/Oe, more preferably at least 0.10%/Oe, especially 0.10 to 0.30%/Ce. These properties insure the use of the multilayer film as reading MR heads for high density recording. If the anizotropic magnetic field Hk of the first magnetic thin film is less than 1 Oe, especially less than 3 Oe, it is approximate to the coercive force, and the multilayer film would not provide an MR change curve which is linear across zero magnetic field or satisfy the MR head requirements. If the Hk is more than 20 Oe, the multilayer film would have a reduced MR slope so that MR heads constructed therefrom will provide low outputs and low resolution.

It is to be noted that the MR ratio is calculated as (ρmax −ρsat)/ρsat×100% wherein $ρ_{max}$ is maximum resistivity and $ρ_{sat}$ is minimum resistivity; the Axis hysteresis width is obtained by measuring MR to depict an MR curve over the magnetic field range between −50 Oe and +50 Oe and determining the maximum hysteresis width from the hysteresis loop; the MR slope is obtained by measuring an MR to depict an MR curve, determining a differential curve thereof, and determining a maximum differential value over the magnetic field range between −50 Oe and +50 Oe; and the high-frequency MR slope is obtained by measuring an MR ratio in an alternating magnetic field of 5 Oe at a frequency of 1 MHz and determining a gradient thereof between −2 Oe and +2 Oe.

The artificial superlattice magnetic multilayer film of the invention may have any desired repetitive number (n) of alternately stacked magnetic and non-magnetic thin films. The repetitive number (n) may be suitably selected in accordance with a desired MR ratio although n of 3 or more is preferred to provide a sufficient MR ratio. As the repetitive number (a) is increased, the MR ratio is also increased at the sacrifice of production yield. With a too large repetitive number (a), the element as a whole has a reduced resistance which is inconvenient for practical use. Then the repetitive number (n) is preferably up to 50. The long period superlattice structure can be observed by taking a small angle X-ray diffraction pattern where primary and secondary peaks corresponding to recurring periodicities appear.

Only two types of magnetic thin films having different coercive forces are used in the illustrated embodiment. Another embodiment using three or more types of magnetic thin films having different coercive forces has the advantage that there can be provided two or more external magnetic fields by which the magnetization direction is reversed, expanding the range of operating magnetic field intensity.

It is also effective to alleviate the difference in surface energy between the substrate material and the artificial superlattice-constituting material for improving wetting between them. In this regard, a thin film of a metal such as Cr, Fe, Co, Ni, W, Ti, V, and Mn or an alloy thereof may be formed to a thickness of about 10 to 100 Å as an undercoat layer underlying the magnetic multilayer film in order to establish a multilayer structure having a flat interface over a wider area. On the surface of the uppermost magnetic thin film, an anti-oxidation film of silicon nitride or silicon oxide may be formed and a metallic conductive layer may be formed for electrode tapping.

The magnetic multilayer film can be formed by convention methods such as evaporation, sputtering and molecular beam epitaxy (MBE) methods. The substrate may be of glass, silicon, magnesium oxide, gallium arsenide, ferrite, AlTiC and CaTiO. During deposition of the first magnetic thin film, an external magnetic field typically of 10 to 300 Oe is preferably applied on one direction in a plane coextensive with the film. This leads to a decrease of $SQ_1$ and an increase of Hk. It is to be noted that an external magnetic field may be applied only during deposition of the first magnetic thin film using an apparatus including an electromagnet capable of readily applying a magnetic field at a controlled time, but not during deposition of the second magnetic thin film. Alternatively, an external magnetic field is applied throughout the deposition process.

Figure 3:
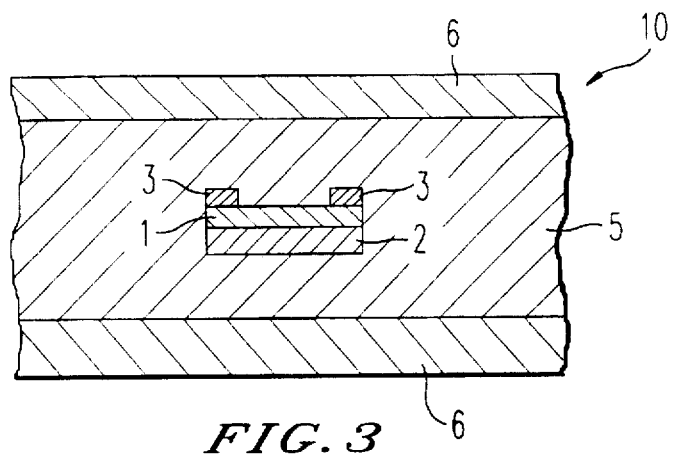
FIG. 3 is a schematic view of a magnetoresistance element according to one embodiment of the invention.
Figure 4:
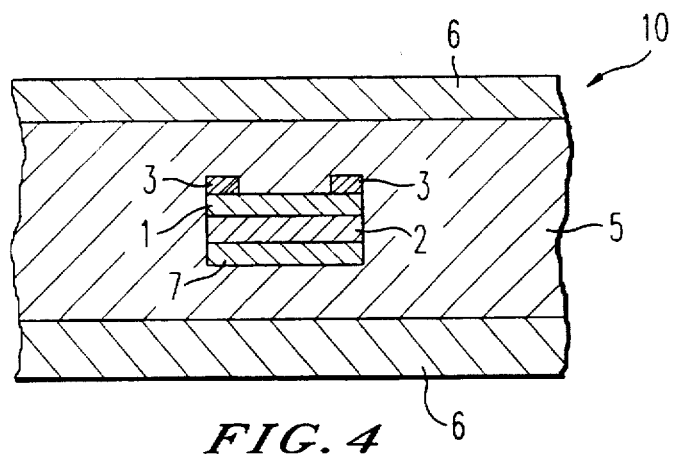
FIG. 4 is a schematic view of a magnetoresistance element according to another embodiment of the invention.

Referring to FIGS. 3 and 4, the magnetic multilayer film of the invention is shown as embodying magnetoresistance elements such as MR heads. Each of the magnetoresistance elements 10 shown in FIGS. 3 and 4 includes a magnetic multilayer film 1 formed within an insulating layer 5. Electrodes 3 and 3 of Cu, Ag and An, for example, are deposited on the magnetic multilayer film 1 for conducting measuring electric current across the film 1. A shunt layer 2 of Ti, for example, is joined to the lower surface of the film 1. The insulating layer 5 and hence the magnetic multilayer film 1 is sandwiched between shields 6 and 6 of Sendust or Permalloy. In the embodiment of FIG. 4, a Layer 7 of high-resistivity soft magnetic material such as CoZrMo and NiFeRh is joined to the lower surface of the shunt layer 2 for applying a biasing magnetic field. It is to be noted that the biasing magnetic field applying means and shunt layer can be omitted because the magnetic multilayer film of the invention is characterized by a better zero field rise.

Figure 5:
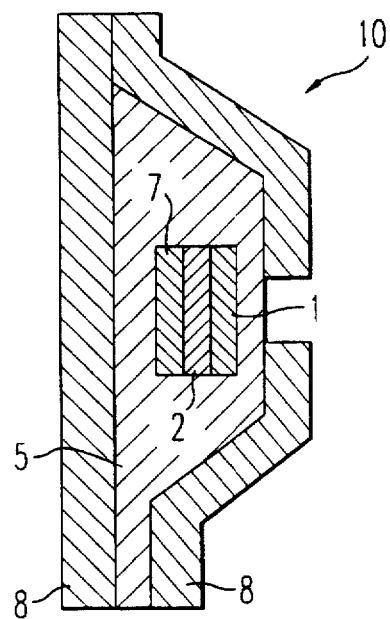
FIG. 5 is a cross sectional view of a magnetoresistance element according to the invention as applied to a yoke type MR head.

FIG. 5 illustrates the magnetic multilayer film of the invention as being applied to a yoke type MR head 10. A magnetic multilayer film 1 is covered with a thin insulating layer 5 and disposed between a pair of yokes 8 for producing a magnetic flux. One of the yokes 8 is provided with a notch through which the film 1 faces outward. The film 1 is provided with electrodes (not shown) for conducting electric current flow parallel to or perpendicular to the direction of a magnetic path generated by the yokes 8. The magnetic multilayer film 1 is assembled with a shunt layer 2 and a layer 7 for applying a biasing magnetic field as in FIG. 4 although the biasing magnetic field applying means and shunt layer can be omitted because the magnetic multilayer film of the invention is characterized by a better zero field rise.

The process for the fabrication of magnetoresistance elements involves patterning and flattening steps which include heat treatments such as baking, annealing and resist curing. The magnetic multilayer film in the first preferred form of the invention is well resistant against heat and tolerates heat treatment at temperatures of up to 500° C., often 50° to 400° C., typically 50° to 350° C. The magnetic multilayer films in the second and third preferred forms of the invention tolerate heat treatment at temperatures of up to 500° C., often 200° to 400° C. for about one hour. Such heat treatment may be carried out in vacuum, an inert gas atmosphere or air. In the second and third preferred forms, it is preferred to carry out heat treatment in a vacuum of $10^{-5}$ to $10^{-9}$ Torr because the resulting magnetic multilayer film experiences little loss of properties.

EXAMPLE

Examples of the present invention are given below by way of illustration and not by way of limitation.

Example 1 demonstrates the first preferred form of the invention.

A glass substrate (4 in FIG. 1) was placed in a ultra-high vacuum evaporation vessel which was evacuated to a vacuum of $10^{-9}$ to $10^{-10}$ Torr. While rotating the substrate at room temperature, a: artificial superlattice magnetic multilayer film (1 in FIG. 1) of the following composition was deposited on the substrate. Deposition was carried out at a film growth rate of about 0.3 Å/sec. by an MBE method while a magnetic field was applied in one direction in a plane coextensive with the substrate.

Table 1 shows the arrangement of magnetic and non-magnetic thin film in the multilayer film and a magnetoresistance (MR) ratio thereof. For example, sample No. 3 in Table 1 is $|Cu(50)/Co(20)/Cu(50)/Ni_{0.8}Fe_{0.2}(30)|\times 10$ which means that a procedure consisting of steps of successively depositing a non-magnetic thin film of Cu of 50 Å thick, a first magnetic thin film of NiFe or Permalloy magnetic alloy (Ni80%–Fe20%) of 30 Å thick, a second magnetic thin film of Co of 20 Å thick, and a non-magnetic thin film of Cu of 50 Å thick was repeated 10 times. Since the number of repeated deposition procedures was for all the samples, each procedure or multilayer unit is expressed in Table 1 as (50, 20, 30) in the order of $(Cu/t_3, Co/t_2, NiFe/t_1)$. In all the samples, a chromium layer of 50 Å thick was formed as an undercoat layer.

Magnetization and a B-H loop were measured by means of a vibrating sample magnetometer (VSM). Separately for resistance measurement, the sample was cut into a strip of 0.5 mm×10 mm, which was measured for resistance by a four terminal method. For measurement, electric current was longitudinally passed through the strip and an external magnetic field was applied in plane and perpendicular to the electric current and varied from −300 Oe to +300 Oe. From the resistance measurement, minimum resistivity ρsat and a MR ratio (ΔR/R) were determined. The MR ratio ΔR/R is calculated according to the equation:

$$\Delta R/R = (\rho_{max} - \rho_{sat})/\rho_{sat} \times 100\%$$

wherein $\rho_{max}$ is the maximum resistivity. Further, a difference in MR ratio under an applied magnetic field of from −3 Oe to +3 Oe was measured and regarded as a zero magnetic field gradient for evaluating rise property. The value of zero field gradient must be 0.5% or more as previously mentioned.

Separately, a 2-element artificial superlattice was prepared using a first magnetic thin film (NiFe) or a second magnetic thin film (Co) and a non-magnetic thin film (Cu). This sample was also measured for squareness ratios $SQ_1$ and $SQ_2$, their relative ratio $SQ_2/SQ_1$, and anisotropic magnetic field Hk of NiFe.

The results (initial properties) are shown in Table 1. Table 1 also reports the intensity of the magnetic field that was applied in one in-plan direction during NiFe deposition.

The samples were heat treated in vacuum at 350° C. for 2 hours. Table 2 reports the squareness ratio, $\rho_{sat}$, MR ratio, and zero field gradient of the heat treated samples together with their changes from the initial ones.

TABLE 1

| Sample No. | Multilayer film thickness (Cu, Co, NiFe) t2 t1 | ρsat (μΩcm) | MR ratio (%) | Squareness ratio | | | Zero magnetic field gradient (%) | Magnetic field applied during deposition (Oe) | First magnetic layer's HK (Oe) |
|---|---|---|---|---|---|---|---|---|---|
| | | | | SQ1 NiFe | SQ2 Co | SQ2/SQ1 | | | |
| 1 | (50, 20, 20) | 9.559 | 7.7 | 0.19 | 0.80 | 4.2 | 1.3 | 200 | 3.0 |
| 2 | (50, 15, 20) | 9.730 | 7.4 | 0.21 | 0.73 | 2.9 | 1.2 | 200 | 6.8 |
| 3 | (50, 20, 30) | 10.202 | 7.9 | 0.11 | 0.90 | 8.2 | 1.9 | 200 | 5.0 |

TABLE 1-continued

| | Multilayer film | | | Squareness ratio | | | Zero magnetic | Magnetic field | First magnetic |
|---|---|---|---|---|---|---|---|---|---|
| Sample No. | thickness (Cu, Co, NiFe) t2 t1 | ρsat (μΩcm) | MR ratio (%) | SQ1 NiFe | SQ2 Co | SQ2/SQ1 | field gradient (%) | applied during deposition (Oe) | layer's HK (Oe) |
| 4 | (50, 25, 40) | 9.711 | 7.1 | 0.12 | 0.88 | 7.3 | 1.8 | 200 | 4.5 |
| 5 | (60, 20, 50) | 9.595 | 6.6 | 0.11 | 0.93 | 8.5 | 1.8 | 200 | 5.3 |
| 6 | (40, 28, 40) | 10.101 | 8.1 | 0.15 | 0.91 | 6.1 | 1.4 | 200 | 7.0 |
| 7 | (60, 25, 50) | 8.595 | 6.5 | 0.17 | 0.90 | 5.3 | 1.8 | 200 | 6.0 |
| 8 | (40, 20, 40) | 9.811 | 7.8 | 0.14 | 0.82 | 5.9 | 1.2 | 200 | 8.2 |
| 9(comparison) | (50, 10, 10) | 9.711 | 5.1 | 0.60 | 0.55 | 0.9 | 1.6 | 0 | 1.2 |
| 10(comparison) | (50, 20, 20) | 9.577 | 7.7 | 0.88 | 0.78 | 0.9 | 0.6 | 0 | 0.6 |
| 11(comparison) | (50, 40, 40) | 10.893 | 5.4 | 0.14 | 0.91 | 6.5 | 0.2 | 200 | 14.3 |
| 12(comparison) | (60, 40, 10) | 9.892 | 4.6 | 0.60 | 0.91 | 1.5 | 0.4 | 0 | 0.9 |
| 13(comparison) | (60, 20, 20) | 8.595 | 6.6 | 0.90 | 0.62 | 0.7 | 0.7 | 0 | 0.5 |
| 14(comparison) | (40, 20, 20) | 8.595 | 6.6 | 0.97 | 0.90 | 1.1 | 0.2 | 0 | 0.4 |
| 15(comparison) | (50, 30, 10) | 9.792 | 5.2 | 0.60 | 0.91 | 1.5 | 0.3 | 0 | 0.7 |

TABLE 2

| | Squareness ratio | | After 350° C./2 hour heat treatment | | | | |
|---|---|---|---|---|---|---|---|
| Sample | SQ1 | SQ2 | ρsat | MR ratio | | Zero magnetic field gradient | |
| No. | NiFe | Co | (μΩcm) | (%) | Change (%) | (%) | Change (%) |
| 1 | 0.21 | 0.82 | 10.121 | 5.8 | −25 | 1.7 | +6 |
| 2 | 0.23 | 0.78 | 10.365 | 5.3 | −28 | 1.1 | −8 |
| 3 | 0.13 | 0.88 | 10.894 | 6.1 | −23 | 2.2 | +16 |
| 4 | 0.15 | 0.88 | 10.412 | 5.5 | −23 | 1.6 | −9 |
| 5 | 0.14 | 0.90 | 10.023 | 5.2 | −21 | 2.1 | +14 |
| 6 | 0.16 | 0.89 | 10.988 | 5.9 | −27 | 1.7 | +21 |
| 7 | 0.17 | 0.87 | 9.874 | 5.1 | −22 | 1.6 | −11 |
| 8 | 0.16 | 0.85 | 10.294 | 6.2 | −21 | 1.5 | +25 |
| 9(comparison) | 0.62 | 0.56 | 10.396 | 2.6 | −49 | 0.08 | −95 |
| 10(comparison) | 0.84 | 0.69 | 11.114 | 4.3 | −44 | 0.21 | −62 |
| 11(comparison) | 0.92 | 0.93 | 11.738 | 4.1 | −24 | 0.18 | −10 |
| 12(comparison) | 0.58 | 0.92 | 10.912 | 3.1 | −33 | 0.23 | −43 |
| 13(comparison) | 0.82 | 0.65 | 9.371 | 3.2 | −52 | 0.31 | −58 |
| 14(comparison) | 0.87 | 0.86 | 9.426 | 3.3 | −50 | 0.16 | −30 |
| 15(comparison) | 0.61 | 0.93 | 10.761 | 2.1 | −68 | 0.11 | −95 |

As is evident from the data of Table 2, only sample Nos. 1 to 8 within the scope of the invention provide a zero field gradient of more than 1% and an MR ratio of more than 5% both at the initial and after the heat treatment.

Figure 6A:
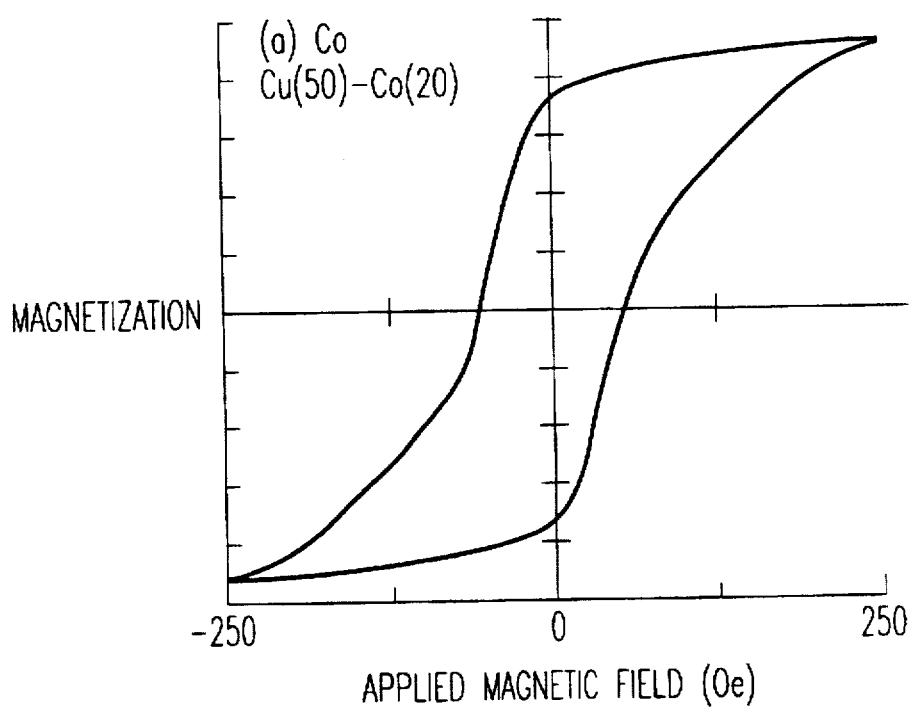
FIG. 6 is diagrams showing M-H curves of first and second magnetic thin films as-deposited according to the first preferred form of the invention.
Figure 6B:
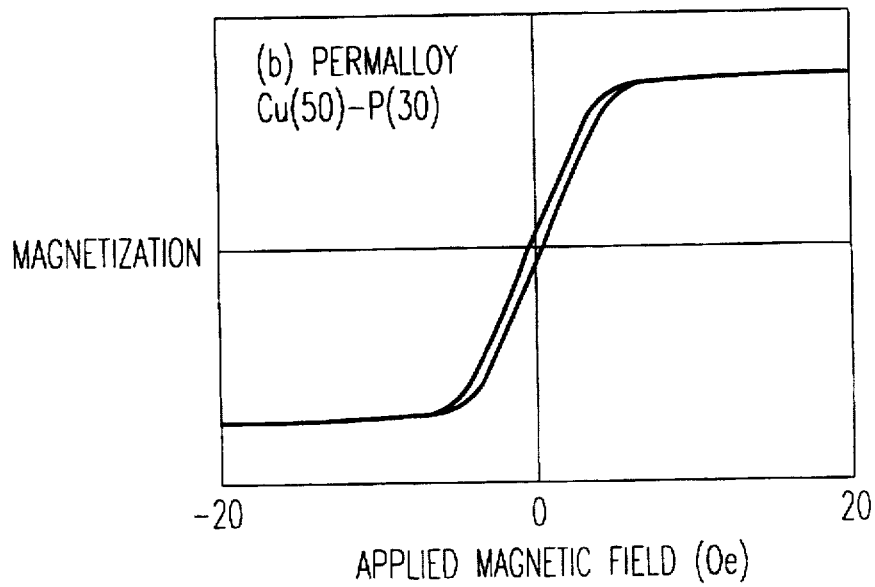
Figure 7:
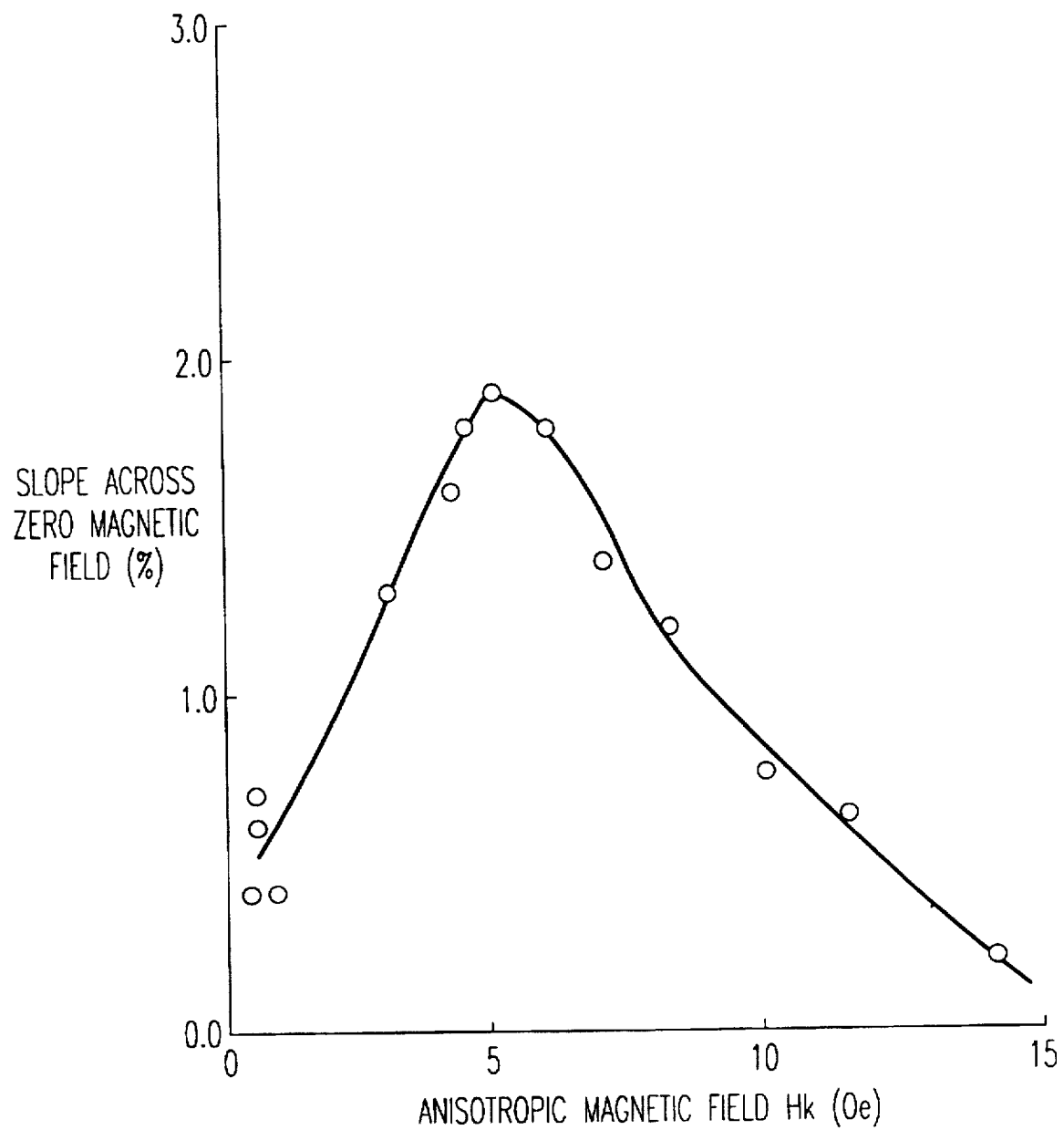
FIG. 7 is a graph showing the slope at zero magnetic field of an MR curve of a magnetic multilayer film in the first preferred form relative to the Hk of the first magnetic thin film.
Figure 9:
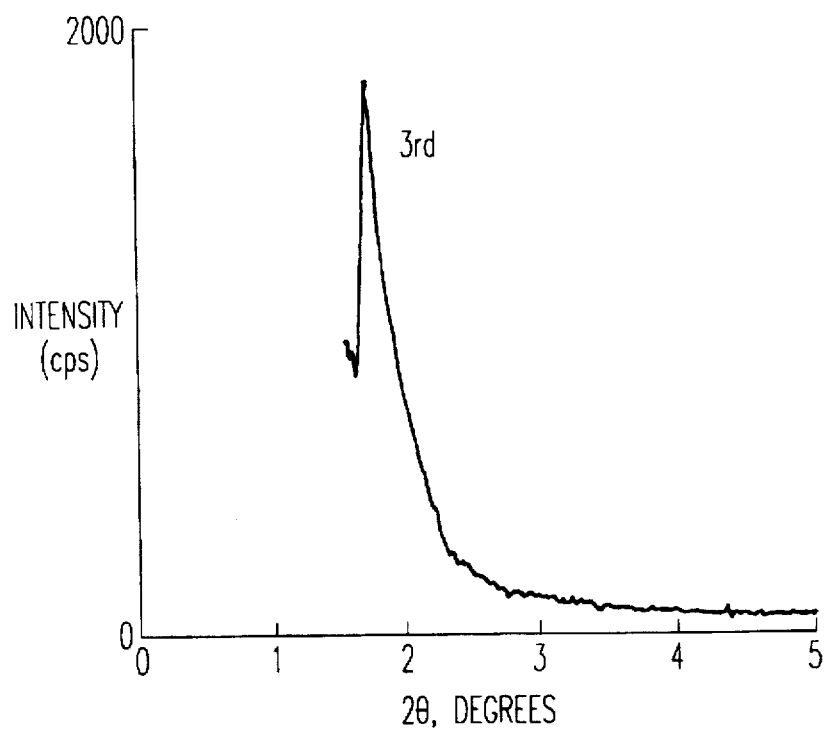
FIG. 9 is an x-ray diffraction pattern of a magnetic multilayer film in the first preferred form after heat treatment.

FIG. 6 shows M-H loops of as-deposited first and second magnetic thin films constituting sample No. 3. FIG. 7 shows the zero magnetic field gradient versus Hk of the fist magnetic thin film. FIGS. 8 and 9 are X-ray diffraction patterns of as-deposited and heat treated sample No. 3, respectively. It is seen from these figures that the samples within the scope of the invention maintain a artificial periodicity lattice structure both as deposited and after heat treatment.

Example 2 demonstrates the second preferred form of the invention.

Example 2

A three-element artificial lattice magnetic multilayer film Cr(50)|Cu(50)-Co(10)-Cu(50)-NiFe(10)|×10 was formed on a glass substrate in a MBE apparatus using a ultra-high vacuum multi-source evaporation technique. The ultimate vacuum was $4\times10^{-11}$ Torr, the vacuum during deposition was $8\times10^{-10}$ Torr, and the film growth rate was 0.2 to 0.5 Å/sec. A magnetic field of 180 Oe was applied in an in-plan; direction during deposition.

Figure 10:
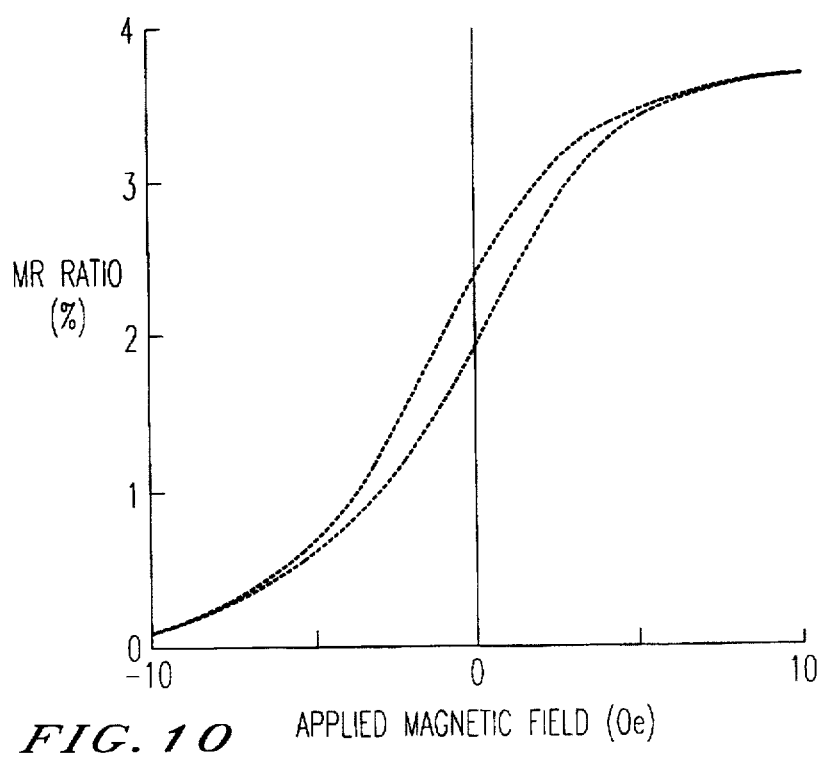
FIG. 10 is a diagram showing MR ratio and applied magnetic field when a magnetic field in the range between −10 Oe and +10 Oe is applied to a magnetic multilayer film in the second preferred form.

An MR curve of the resulting sample was measured. FIG. 10 is a chart obtained by sweeping 5 cycles the intensity of applied magnetic field over the range between −10 Oa and +10 Oe. The MR curve showed a MR slope of 0.30%/Oe and a MR ratio of 5.7%, and included a linear portion over a magnetic field width of about 8 Oe.

The third preferred form of the invention is demonstrated by Examples 3–6 and Comparative Example 1.

Example 3

An artificial lattice was prepared by depositing a non-magnetic metal layer of Cr on a Corning 7059 glass substrate to form an undercoat layer of 50 Å and then depositing a magnetic multilayer film of Cu/Co/Cu/NiFe with a number of repetitive deposition procedures of 10. Deposition by a MBE technique was carried out under conditions including an ultimate vacuum of $2\times10^{-10}$ Torr, a vacuuam during deposition of $1\times10^{-9}$ Torr, a substrate temperature of about 40° C., and a film growth rate of 0.1 to 0.4 Å/sec. A magnetic field of 180 Oe was applied in an in-plane direction of the substrate during deposition.

Sample Nos. 21 to 27 were prepared in the magnetic field of 90 Oe by depositing magnetic multilayer films while varying the thicknesses Oe respective layers (Cu/$t_3$, Co/$t_2$, NiFe/$t_1$) as shown in Table 3, and then heat treating in vacuum at 250° C. for one hour. The samples were evaluated with the results shown in Table 3. Film thickness is expressed in angstrom (Å). It is to be noted that sample Nos. 21 to 27 had a $SQ_1$ of 0.01 to 0.5, a $SQ_2$ of 0.7 to 1.0, and a $SQ_2/SQ_1$ ratio between 2 and 100.

TABLE 3

| Sample No. | Multilayer film thickness (t3, t2, t1) | ρsat (μΩcm) | MR ratio (%) | First magnetic layer's HK (Oe) | MR slope (%/Oe) | High-frequency slope (at 1 MHz, %/Oe) |
|---|---|---|---|---|---|---|
| 21 | (42, 10, 13) | 9.848 | 8.1 | 7.1 | 0.25 | 0.12 |
| 22 | (43, 10, 10) | 10.058 | 8.4 | 8.2 | 0.21 | 0.13 |
| 23 | (41, 13, 15) | 10.118 | 7.6 | 6.5 | 0.22 | 0.11 |
| 24 | (45, 12, 18) | 9.819 | 7.8 | 5.3 | 0.27 | 0.16 |
| 25 | (12, 12, 15) | 15.382 | 6.5 | 6.3 | 0.30 | 0.10 |
| 26(comparison) | (50, 10, 10) | 9.316 | 5.7 | 8.0 | 0.30 | 0.06 |
| 27(comparison) | (60, 10, 10) | 9.012 | 5.7 | 7.5 | 0.19 | 0.06 |
| 31(comparison) | (45, 10, 13) | 9.051 | 7.0 | 0.8 | 0.23 | 0.06 |
| 32(comparison) | (45, 10, 10) | 8.915 | 6.1 | 1.1 | 0.16 | 0.02 |
| 33(comparison) | (42, 13, 13) | 10.276 | 7.9 | 0.8 | 0.22 | 0.07 |
| 34(comparison) | (50, 10, 10) | 9.238 | 5.6 | 1.2 | 0.29 | 0.07 |
| 35(comparison) | (55, 10, 10) | 9.124 | 4.2 | 1.2 | 0.18 | 0.05 |

Comparative Example 1

Sample Nos. 31 to 35 were prepared by depositing magnetic multilayer films by the same procedure as Example 3 except that no magnetic field was applied.

The thicknesses of respective layers (Cu/$t_3$, Co/$t_2$, NiFe/$t_1$) were varied as shown in Table 3. The films were heat treated as in Example 3. The samples were evaluated with the results shown in Table 3. Film thickness is expressed in angstrom (Å). It in to be noted that sample Nos. 31 to 35 had a $SQ_1$ in excess of 0.5.

As seen from Table 3, a large high-frequency slope was obtained when the first magnetic thin film was deposited in the presence of an applied magnetic field so as to provide an anisotropic magnetic field Hk of 3 to 20 Oe. Even when Hk was in the desirable range, a gentle high-frequency slope was obtained at $t_3 \geq 50$ Å.

Example 4

Figure 11:
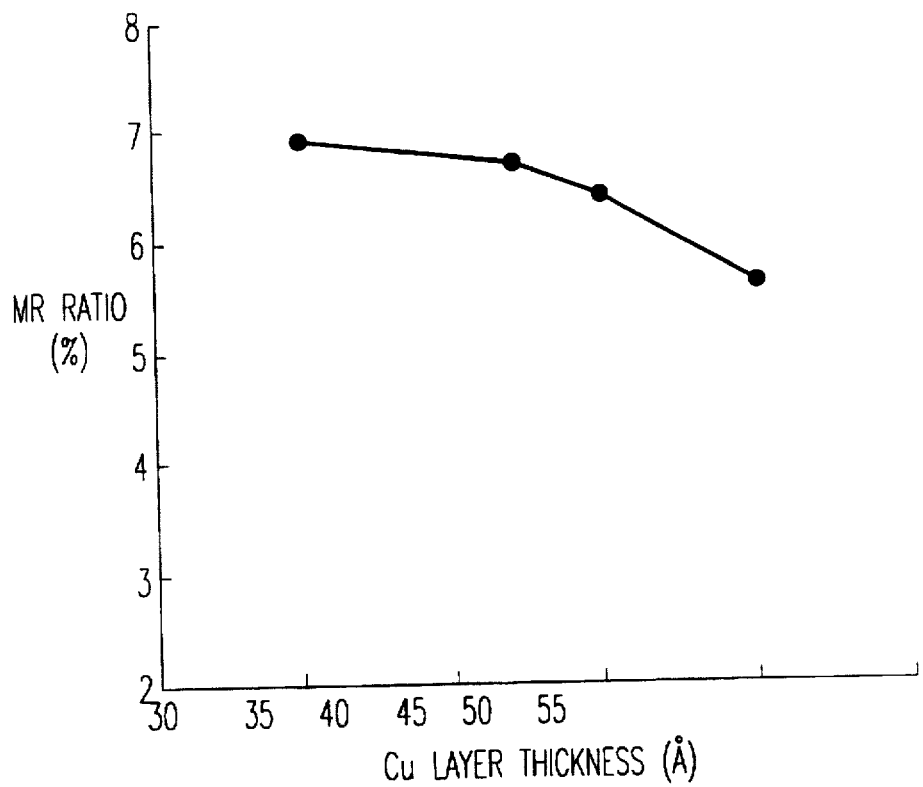
FIG. 11 is a diagram showing the MR ratio of a magnetic multilayer film in the third preferred form relative to the thickness of a Cu layer.

Magnetic multilayer films were prepared by the same procedure as in Example 3 except that both the Co and NiFe layers had a fixed thickness of 10 Å and the thickness of Cu layers was varied to 35, 42, 45 and 50 Å. A magnetic field of 180 Oe was applied during deposition. The films were measured for MR ratio, with the results shown in FIG. 11.

MR ratio was improved when the thickness of Cu layers was less than 50 Å ($t_3<50$ Å). Additionally, MR ratio was significantly increased as compared the MR ratio that would be achieved when no Hk was imparted to the NiFe layers.

Example 5

Magnetic multilayer films were prepared by the same procedure as in Example 3 except that the Co layers had a fixed thickness of 10 Å, the Cu layers had a fixed thickness of 45 Å and the thickness of NiFe layers was varied to 10, 13, 15, 20, 30, 40 and 50 Å. A magnetic field of 180 Oe was applied during deposition. MR curves of the films were determined over a magnetic field range between −50 Oe and +50 Oe, from which the maximum hysteresis width which is the width of opening of a MR cue was obtained.

Figure 12:
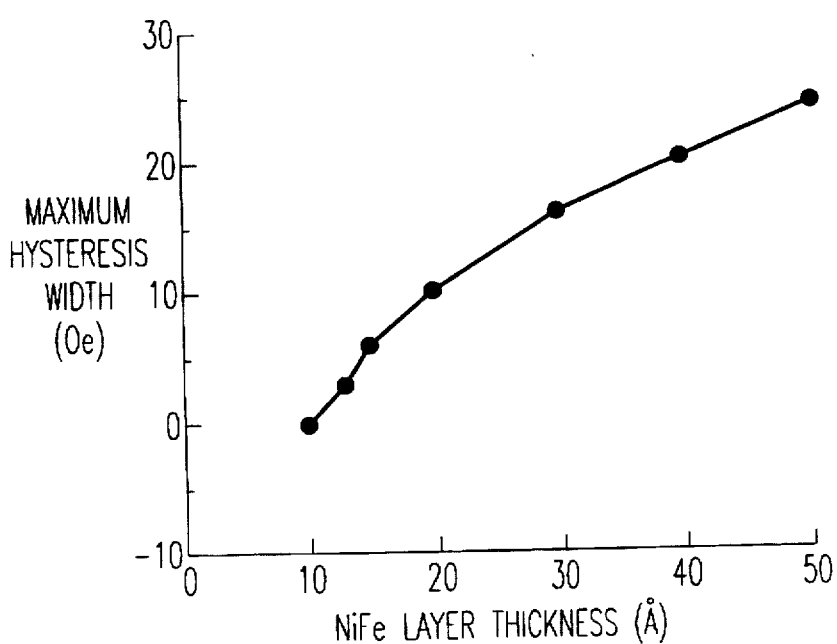
FIG. 12 is a diagram showing the maximum hysteresis width of an MR curve of a magnetic multilayer film in the third preferred form relative to the thickness of a NiFe layer.

The results are shown in FIG. 12. It is seen that the maximum hysteresis width of a MR curves increases as the NiFe layers are increased in thickness.

Example 6

A magnetic multilayer film of Cr(50)|Cu(42)-Co(10)-Cu (42)NiFe(13)|×10 was deposited by the same procedure as in Example 3 except that the magnetic field applied during deposition had an intensity of 90 Oe.

Figure 13:
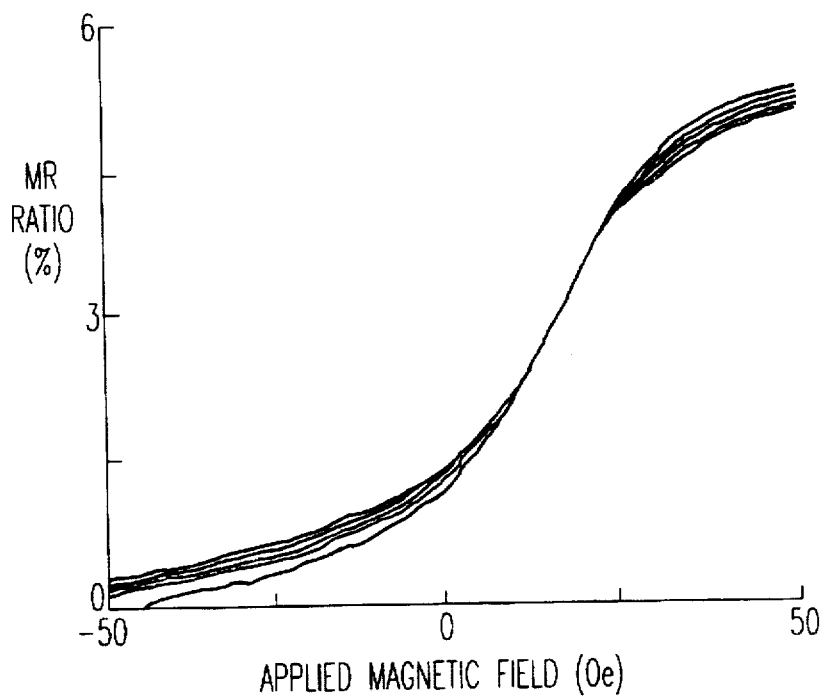
FIG. 13 is a diagram showing MR ratio and applied magnetic field when a magnetic field in the range between −50 Oe and +50 Oe is applied to a magnetic multilayer film in the third preferred form.

An MR curve of the resulting sample was measured. FIG. 13 is a chart obtained by sweeping 5 cycles the intensity of applied magnetic field over the range between −50 Oe and +50 Oe. Little hysteresis was acknowledged on the MR curves.

Example 7

Figure 14:
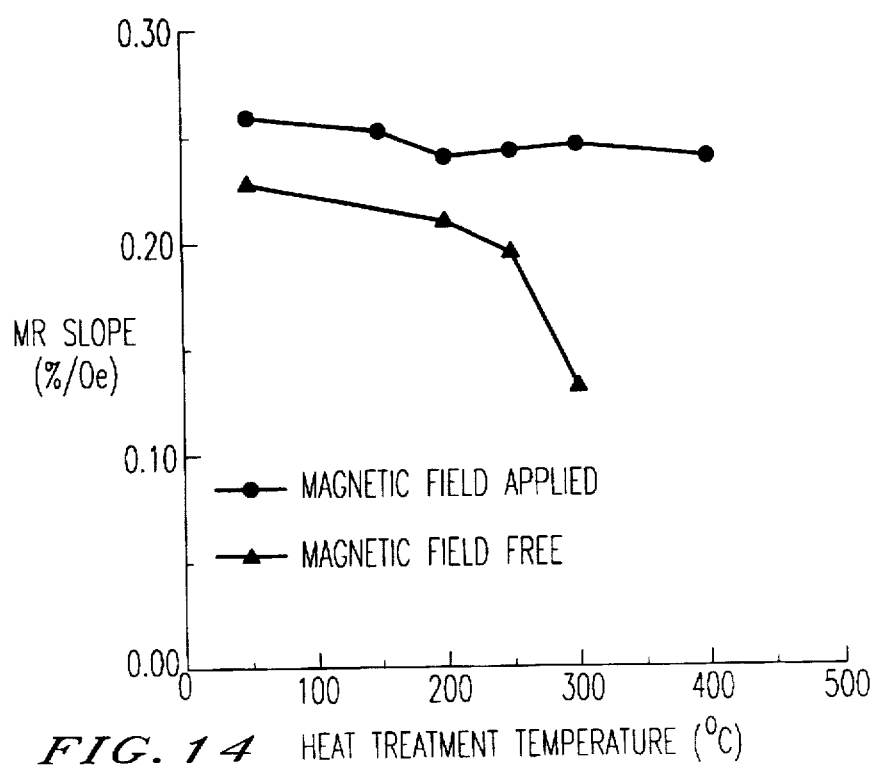
FIG. 14 is a diagram showing the MR slopes of a magnetic multilayer film in the third preferred form and a comparative example relative to the heat treatment temperature.
Figure 15A:
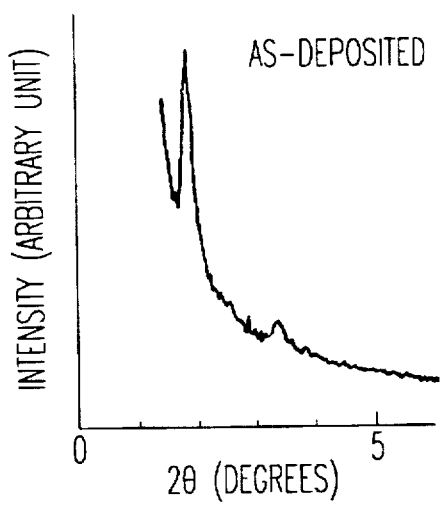
FIG. 15 show X-ray diffraction patterns of magnetic multilayer films in the third preferred form heat treated at different temperatures.
Figure 15D:
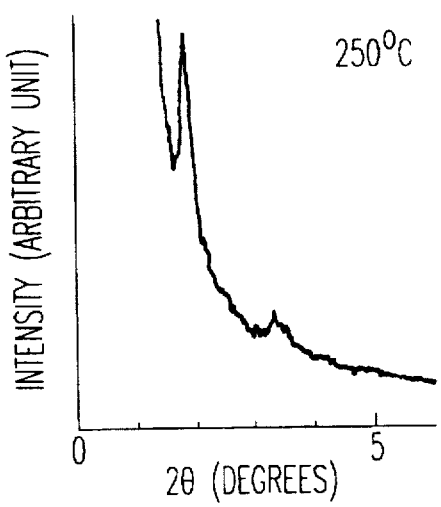
Figure 15B:
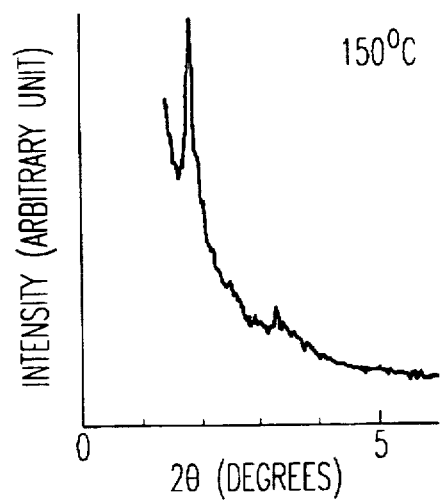
Figure 15E:
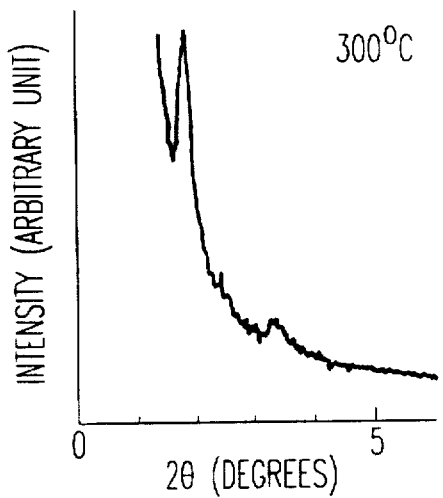
Figure 15C:
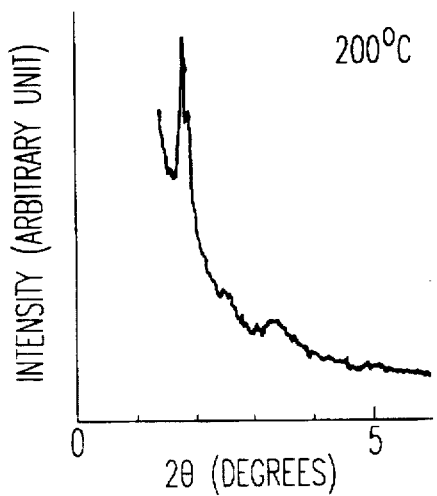

Two magnetic multilayer film of Cr(50)[Cu(42)-Co(10) Cu(42)-NiFe(13)]×10 were deposited by the same procedure as in Example 3 while deposition was done in the presence or absence of a magnetic field of 180 Oe. They are designated a magnetic-field-applied sample and a magnetic-field-free sample. For both the samples, a strip of 0.5×6 mm (for the MR properties estimation) and a disk of 10 mm (for the structural estimation) diameter were patterned from the same substrate. The magnetic-field-applied samples were heat treated at temperatures of 150°, 200°, 250°, 300° and 400° C., and the magnetic-field-free samples were heat treated at temperatures of 200°, 250° and 300° C., all in vacuum for one hour. The samples both as deposited and after heat treatment were determined for MR ratio and MR slope. The results of MR slope were shown in FIG. 14. The values of as deposited samples are plotted at a heat treatment temperature of 50° C.

In the magnetic-field-applied samples, the MR slope remained unchanged after heat treatment. In the magnetic-field-free samples, the MR slope significantly decreased after heat treatment. The same results were obtained for MR ratio.

FIG. 15 shows small-angle X-ray diffraction patterns of the magnetic-field-applied samples after heat treatment at different temperatures. There is found little difference in the position and intensity of a diffraction peak corresponding to the artificial lattice periodicity, indicating the retention of the structure.

The first preferred form of the invention provides a magnetic multilayer film having a great MR ratio of several percents to several ten percents in a low external magnetic field of several oersted to several ten oersted, a sharp rise at zero magnetic field and high heat resistance. The second preferred form of the invention provides a magnetic multilayer film additionally having improved hysteresis and MR slope in an applied magnetic field in the range between −10 Oe and +10 Oe. The third preferred form of the invention provides a magnetic multilayer film having a high MR slope of at least 0.15%/Oe in au applied magnetic field in the range between −50 Oe and +50 Oe, improved hysteresis of MR ratio, and a high MR slope in a high-frequency magnetic field. From these magnetic multilayer films, there are obtained improved MR elements as typified by high sensitivity MR sensors and MR heads capable of high density magnetic recording.

We claim:

1. A magnetic multilayer film, comprising a first and a second magnetic thin film with a non-magnetic thin film between said first and second magnetic thin films, wherein said first and second magnetic thin films have different coercive forces, said first magnetic thin film having a lower coercive force than said first magnetic thin film and a squareness ratio $SQ_1$ of from 0.01 to 0.5, and said second magnetic thin film having a higher coercive force than said first magnetic thin film and a squareness $SQ_2$ of from 0.7 to 1.0, said first and second magnetic thin films and said non-magnetic thin film each have a thickness of up to 200 Å.

2. The magnetic multilayer film of claim 1 wherein $SQ_2/SQ_1$ is from 2 to 100.

3. The magnetic multilayer film of claim 1 wherein said first magnetic thin film has an anisotropic magnetic field Hk of 1 to 20 Oe.

4. The magnetic multilayer film of claim 3 wherein said first magnetic thin film has an anisotropic magnetic field Hk of 3 to 20 Oe.

5. The magnetic multilayer film of claim 1 wherein said first magnetic thin film has a thickness $t_1$ and said second magnetic thin film has a thickness $t_2$ wherein $t_1 \geq t_2$.

6. The magnetic multilayer film of claim 1 which produces a magnetoresistance curve which includes a linear portion having a slope of at least 0.15%/Oe in the magnetic field range between −50 Oe and +50 Oe and has a maximum hysteresis width of up to 20 Oe.

7. The magnetic multilayer film of claim 1 wherein said first magnetic thin film comprises $(Ni_xFe_{1-x})_yCo_{1-y}$ wherein $0.7 \leq x \leq 0.9$ and $0.5 \leq y \leq 1.0$.

8. The magnetic multilayer film of claim 1 wherein said second magnetic thin film comprises $(Co_zNi_{1-z})_wFe_{1-w}$ wherein $0.4 \leq z \leq 1.0$ and $0.5 \leq w \leq 1.0$.

9. The magnetic multilayer film of claim 1 wherein said first magnetic thin film has been deposited while applying an external magnetic field in one in-plane direction.

10. The magnetic multilayer film of claim 9 wherein said external magnetic field has an intensity of 10 to 300 Oe.

11. The magnetic multilayer film of claim 1 which is prepared by a method comprising the steps of:

depositing at least two magnetic thin films while interposing a non-magnetic thin film therebetween and effecting heat treatment at a temperature of up to 500° C.

12. A magnetic resistance element, comprising a substrate; and a magnetic multilayer film, comprising a first and a second magnetic thin film with a non-magnetic thin film between said first and second magnetic thin films, wherein said first and second magnetic thin films have different coercive forces, said first magnetic thin film having a lower coercive force than said second magnetic thin film and a squareness ratio $SQ_1$ of from 0.01 to 0.5, and said second magnetic thin film having a higher coercive force than said second magnetic thin film and a squareness ration $SQ_2$ of from 0.7 to 1.0, said first and second magnetic thin films and said non-magnetic thin film each having a thickness of up to 200 Å.

13. The magnetoresistance element of claim 12, wherein $SQ_2/SQ_1$ is from 2 to 100.

14. The magnetoresistance element of claim 12, wherein said first magnetic thin film has an anisotropic magnetic field Hk of 1 to 20 Oe.

15. The magnetoresistance element of claim 12, wherein said first magnetic thin film has a thickness $t_1$ and said second magnetic thin film has a thickness $t_2$, wherein $t_1 \geq t_2$.

16. The magnetoresistance element of claim 15, wherein said non-magnetic thin film has a thickness $t_3$ wherein $t_3 < 50$ Å.

17. The magnetoresistance element of claim 12, which produces a magnetoresistance curve which includes a linear portion having a slope of at least 0.15%/Oe in the magnetic field range between −50 Oe and +50 Oe and has a maximum hysteresis width of up to 20 Oe.

18. The magnetoresistance element of claim 12, wherein said first magnetic thin film comprises $(Ni_xFe_{1-x})_yCo_{1-y}$ wherein $0.7 \leq x \leq 0.9$ nd $0.5 \leq y \leq 1.0$.

19. The magnetoresistance element of claim 12, wherein said second magnetic thin film comprises $(Co_zNi_{1-z})_wFe_{1-w}$ wherein $0.4 \leq z \leq 1.0$ and $0.5 \leq w \leq 1.0$.

20. The magnetoresistance element of claim 12, wherein said first magnetic thin film has been deposited while applying an external magnetic field in one in-plane direction.

21. The magnetoresistance element of claim 20, wherein said external magnetic field has an intensity of 10 to 300 Oe.

22. The magnetoresistance element of claim 12, which is prepared by a method comprising the steps of:

depositing at least two magnetic thin films while interposing a non-magnetic thin film therebetween and effecting heat treatment at a temperature of up to 500° C.

23. The magnetoresistance element of claim 12, wherein said magnetoresistance element does-not have means for applying a biasing magnetic field.

24. A method of making a magnetic multilayer film, comprising depositing, on a substrate, a first magnetic thin film;

depositing, on said first magnetic thin film, a first non-magnetic thin film; and depositing on said first non-magnetic thin film, a second magnetic thin film;

wherein one of said first or second magnetic thin films is deposited while applying a magnetic field of 10 to 300 Oe in one in-plane direction, said one of said first or second magnetic thin films has a coercive force a, and a squareness ratio $SQ_a$ of from 0.01 to 0.5, the other of said first or second magnetic thin films has a coercive force b, and a squareness ratio $SQ_b$ of from 0.7 to 1.0, a<b, and said first and second magnetic thin films and said non-magnetic thin film each have a thickness of up to 200 Å.

25. The method of claim 24, wherein said magnetic field has an intensity of 10 to 300 Oe.

26. The method of claim 24, further comprising heating said magnetic multilayer film to a temperature of up to 500° C.

27. The method of claim 24, wherein said one of said first or second magnetic thin films has a thickness $t_a$ and said other of said first or second magnetic thin films has a thickness $t_b$, $4 \text{Å} \leq t_b < 30 \text{ Å}$, $6 \text{ Å} \leq t_a$, and $t_a \geq t_b$.

28. The method of claim 24, further comprising depositing, on said substrate, a thin metal film, prior to depositing said first magnetic thin film.

* * * * *

UNITED STATES PATENT AND TRADEMARK OFFICE
CERTIFICATE OF CORRECTION

PATENT NO. : 5,789,069
DATED : August 4, 1998
INVENTOR(S) : Satoru ARAKI et al.

It is certified that error appears in the above-identified patent and that said Letters Patent is hereby corrected as shown below:

On the Title page, Item [*], the Terminal Disclaimer information is missing. It should read:

--[*] Notice: The term of this Patent shall not extend beyond the expiration date of Pat. No. 5,514,452.--

Column 19, Line 19, "said first" should read --said second--.

Column 20, Line 4, "said second" should read --said first--.

Column 20, Line 5, "ration" should read --ratio--.

Column 20, Line 27, "nd" should read --and--.

Column 20, Line 44, "does-not" should read --does not--.

Signed and Sealed this

Fifth Day of October, 1999

Attest:

Q. TODD DICKINSON

*Attesting Officer*  *Acting Commissioner of Patents and Trademarks*